United States Patent
Gould et al.

(10) Patent No.: US 10,431,568 B2
(45) Date of Patent: Oct. 1, 2019

(54) LIGHT EMITTING DIODES, COMPONENTS AND RELATED METHODS

(71) Applicant: Cree, Inc., Durham, NC (US)

(72) Inventors: Troy Gould, Raleigh, NC (US); Colin Kelly Blakely, Franklinton, NC (US); Kyle Damborsky, Morrisville, NC (US); Jesse Colin Reiherzer, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/264,547

(22) Filed: Sep. 13, 2016

(65) Prior Publication Data
US 2017/0069606 A1 Mar. 9, 2017

Related U.S. Application Data

(63) Continuation-in-part of application No. 15/192,790, filed on Jun. 24, 2016, now Pat. No. 10,192,854, and
(Continued)

(51) Int. Cl.
*H01L 25/075* (2006.01)
*H01L 33/50* (2010.01)
(Continued)

(52) U.S. Cl.
CPC ........ *H01L 25/0753* (2013.01); *H01L 33/505* (2013.01); *H01L 33/507* (2013.01);
(Continued)

(58) Field of Classification Search
CPC ....... H01L 2224/49175; H01L 25/0753; H01L 33/486; H01L 33/508; H01L 33/50;
(Continued)

(56) References Cited

U.S. PATENT DOCUMENTS

| 4,918,497 A | 4/1990 | Edmond |
| 4,966,862 A | 10/1990 | Edmond |

(Continued)

FOREIGN PATENT DOCUMENTS

| WO | WO 2012/016850 A1 | 2/2012 | |
| WO | WO-2013038953 A1 * | 3/2013 | .......... H01L 33/504 |

(Continued)

OTHER PUBLICATIONS

International Search Report with Written Opinion for Application No. PCT/US2017/051177 dated Nov. 23, 2017.
(Continued)

*Primary Examiner* — Frederick B Hargrove
(74) *Attorney, Agent, or Firm* — Jenkins, Wilson, Taylor & Hunt, P.A.

(57) ABSTRACT

Light emitting diode (LED) devices, components and systems are provided. LED devices include a submount with a plurality of LEDs disposed thereon. The LEDs mounted on a submount can be spaced apart at predetermined dimensions to control the gaps between each of the plurality of LEDs. By controlling the gaps between LEDs the optical output from the LED device can be optimized, including improving emission and/or color uniformity, minimizing or eliminating deadspots in the light emission, and/or minimizing or eliminating an optical cross. A phosphor layer can be disposed on the plurality of LEDs and between the LEDs in the gaps therebetween.

27 Claims, 20 Drawing Sheets

Related U.S. Application Data a continuation-in-part of application No. 14/575,805, filed on Dec. 18, 2014.

(51) Int. Cl.
*H01L 33/56* (2010.01)
*H01L 33/54* (2010.01)
*H01L 23/00* (2006.01)
*H01L 33/48* (2010.01)
*H01L 33/60* (2010.01)

(52) U.S. Cl.
CPC .............. *H01L 33/54* (2013.01); *H01L 33/56* (2013.01); *H01L 24/48* (2013.01); *H01L 24/49* (2013.01); *H01L 33/486* (2013.01); *H01L 33/508* (2013.01); *H01L 33/60* (2013.01); *H01L 2224/48091* (2013.01); *H01L 2224/48227* (2013.01); *H01L 2224/48247* (2013.01); *H01L 2224/49113* (2013.01); *H01L 2224/49175* (2013.01); *H01L 2224/73265* (2013.01); *H01L 2924/00014* (2013.01); *H01L 2924/181* (2013.01)

(58) Field of Classification Search
CPC ..... H01L 33/502; H01L 33/504; H01L 33/54; H01L 33/58
See application file for complete search history.

(56) References Cited

U.S. PATENT DOCUMENTS

| | | | |
|---|---|---|---|
| 5,027,168 | A | 6/1991 | Edmond |
| 5,210,051 | A | 5/1993 | Carter, Jr. |
| 5,338,944 | A | 8/1994 | Edmond et al. |
| 5,359,345 | A | 10/1994 | Hunter |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,350,041 | B1 | 2/2002 | Tarsa et al. |
| 6,600,175 | B1 | 7/2003 | Baretz et al. |
| 6,791,119 | B2 | 9/2004 | Slater, Jr. et al. |
| 6,853,010 | B2 | 2/2005 | Slater, Jr. et al. |
| 6,867,542 | B1 | 3/2005 | Sun et al. |
| 6,958,497 | B2 | 10/2005 | Emerson et al. |
| 7,095,056 | B2 | 8/2006 | Vitta et al. |
| 7,213,940 | B1 | 5/2007 | Van de Ven et al. |
| 7,456,499 | B2 | 11/2008 | Loh et al. |
| 7,564,180 | B2 | 7/2009 | Brandes |
| 7,614,759 | B2 | 11/2009 | Negley |
| 7,967,652 | B2 | 6/2011 | Emerson |
| D650,342 | S | 12/2011 | Kuwaharada et al. |
| 8,410,679 | B2 | 4/2013 | Ibbetson et al. |
| 8,425,271 | B2 | 4/2013 | Hussell et al. |
| 8,729,589 | B2 | 5/2014 | Hussell et al. |
| D718,725 | S * | 12/2014 | Reiherzer .................... D13/180 |
| 8,970,131 | B2 | 3/2015 | Brandes et al. |
| 9,131,561 | B2 | 9/2015 | Athalye |
| 9,277,605 | B2 | 3/2016 | Ni |
| 9,414,454 | B2 | 8/2016 | Brandes et al. |
| 9,461,201 | B2 | 10/2016 | Heikman et al. |
| 10,192,854 | B2 | 1/2019 | Welch et al. |
| 2004/0218390 | A1 | 11/2004 | Holman et al. |
| 2006/0221272 | A1 | 10/2006 | Negley et al. |
| 2007/0104828 | A1 | 5/2007 | Fomaguera |
| 2007/0139923 | A1 | 6/2007 | Negley et al. |
| 2007/0158668 | A1 | 7/2007 | Tarsa et al. |
| 2007/0170447 | A1 | 7/2007 | Negley et al. |
| 2007/0223219 | A1 | 9/2007 | Medendorp, Jr. et al. |
| 2007/0253209 | A1 | 11/2007 | Loh et al. |
| 2007/0257272 | A1* | 11/2007 | Hutchins ............. H01L 25/0753 257/98 |
| 2008/0012036 | A1 | 1/2008 | Loh et al. |
| 2008/0121921 | A1 | 5/2008 | Loh et al. |
| 2008/0173884 | A1 | 7/2008 | Chitnis et al. |
| 2008/0179611 | A1 | 7/2008 | Chitnis et al. |
| 2008/0198112 | A1 | 8/2008 | Roberts |
| 2008/0258168 | A1 | 10/2008 | Loh et al. |
| 2008/0308825 | A1 | 12/2008 | Chakraborty et al. |
| 2009/0050907 | A1 | 2/2009 | Yuan et al. |
| 2009/0050908 | A1 | 2/2009 | Yuan et al. |
| 2009/0057699 | A1 | 3/2009 | Basin et al. |
| 2009/0080185 | A1 | 3/2009 | McMillan |
| 2009/0160363 | A1 | 6/2009 | Negley et al. |
| 2009/0184616 | A1 | 7/2009 | Van de Ven et al. |
| 2009/0278147 | A1 | 11/2009 | Suzuki |
| 2010/0140633 | A1 | 6/2010 | Emerson |
| 2010/0140634 | A1 | 6/2010 | Van de Ven et al. |
| 2010/0252851 | A1 | 10/2010 | Emerson et al. |
| 2010/0276712 | A1 | 11/2010 | Shaikevitch et al. |
| 2010/0291374 | A1 | 11/2010 | Akarsu et al. |
| 2011/0006334 | A1* | 1/2011 | Ishii .................... C09K 11/584 257/98 |
| 2011/0068702 | A1 | 3/2011 | Van de Ven et al. |
| 2011/0279054 | A1 | 11/2011 | Katona et al. |
| 2012/0068209 | A1 | 3/2012 | Andrews |
| 2012/0087124 | A1 | 4/2012 | Ravillisetty et al. |
| 2012/0112220 | A1 | 5/2012 | West et al. |
| 2012/0119234 | A1 | 5/2012 | Shioi et al. |
| 2012/0193649 | A1 | 8/2012 | Donofrio et al. |
| 2012/0193662 | A1 | 8/2012 | Donofrio et al. |
| 2012/0248483 | A1 | 10/2012 | Beppu et al. |
| 2013/0049025 | A1 | 2/2013 | Chang et al. |
| 2013/0062592 | A1* | 3/2013 | Yen ......................... H01L 33/50 257/13 |
| 2013/0140580 | A1 | 6/2013 | Wirth et al. |
| 2013/0141905 | A1* | 6/2013 | Hussell .................. H01L 33/54 362/235 |
| 2013/0170199 | A1 | 7/2013 | Athalye et al. |
| 2013/0193453 | A1* | 8/2013 | Donofrio ............. H01L 25/0753 257/88 |
| 2014/0027795 | A1 | 1/2014 | Reiherzer et al. |
| 2014/0342480 | A1* | 11/2014 | Matsunaga ........... H01L 33/504 438/29 |
| 2014/0346533 | A1 | 11/2014 | Andrews |
| 2015/0062915 | A1 | 3/2015 | Hussell et al. |
| 2015/0179903 | A1 | 6/2015 | Pun et al. |
| 2015/0221837 | A1 | 8/2015 | Yonezaki et al. |
| 2015/0257211 | A1 | 9/2015 | Johnson et al. |
| 2015/0267906 | A1 | 9/2015 | Wilcox |
| 2015/0345714 | A1 | 12/2015 | Reiherzer et al. |
| 2015/0349218 | A1 | 12/2015 | Reiherzer et al. |
| 2015/0357532 | A1* | 12/2015 | Onuma .............. C09K 11/7708 257/98 |
| 2016/0161098 | A1 | 6/2016 | Tudorica et al. |
| 2017/0373045 | A1 | 12/2017 | Welch et al. |

FOREIGN PATENT DOCUMENTS

| | | |
|---|---|---|
| WO | WO 2013/099193 A1 | 7/2013 |
| WO | WO 2018/052902 | 3/2018 |

OTHER PUBLICATIONS

Notice of Publication for Application No. PCT/US2017/05117 dated Mar. 22, 2018.

Restriction Requirement for U.S. Appl. No. 14/575,805 dated Apr. 12, 2016.

Non-Final Office Action for U.S. Appl. No. 14/575,805 dated Jul. 21, 2016.

Non-Final Office Action for U.S. Appl. No. 15/192,790 dated Jan. 17, 2017.

Final Office Action for U.S. Appl. No. 14/575,805 dated Feb. 27, 2017.

(56) References Cited

OTHER PUBLICATIONS

Advisory Action, Interview Summary, and AFCP Decision for U.S. Appl. No. 14/575,805 dated May 25, 2017.
Final Office Action for U.S. Appl. No. 15/192,790 dated Jul. 5, 2017.
Non-Final Office Action for U.S. Appl. No. 14/575,805 dated Aug. 28, 2017.
Advisory Action for U.S. Appl. No. 15/192,790 dated Sep. 22, 2017.
Non-Final Office Action for U.S. Appl. No. 15/192,790 dated Nov. 3, 2017.
Non-Final Office Action for U.S. Appl. No. 14/575,805 dated Feb. 5, 2018.
Final Office Action for U.S. Appl. No. 15/192,790 dated May 3, 2018.
Advisory Action for U.S. Appl. No. 15/192,790 dated Jul. 27, 2018.
Final Office Action for U.S. Appl. No. 14/575,805 dated Aug. 6, 2018.
Notice of Allowance for U.S. Appl. No. 15/192,790 dated Sep. 7, 2018.
Advisory Action for U.S. Appl. No. 14/575,805 dated Oct. 19, 2018.
Non-Final Office Action for U.S. Appl. No. 14/575,805 dated Nov. 29, 2018.
Non-Final Office Action for U.S. Appl. No. 14/575,805 dated Mar. 12, 2019.
Notice of Allowance for U.S. Appl. No. 14/575,805 dated Jun. 27, 2019.

* cited by examiner

| GROUP | DIE AREA | PANEL AREA | DIE TO PANEL RATIO | COMMENTS |
|---|---|---|---|---|
| SINGLE CHIP | 1.1025 | 2.56 | 0.4307 | CONVENTIONAL LED PACKAGES <= 0.431 |
| | 1.8225 | 6.25 | 0.2916 | |
| | 3.8025 | 12.25 | 0.3104 | |
| | 2.7225 | 6.25 | 0.4356 | PACKAGE ACCORDING TO PRESENT INVENTION >= 0.431 |
| | 5.5225 | 12.25 | 0.4508 | |
| MULTI CHIP | 8.41 | 25 | 0.3364 | PACKAGES ACCORDING TO PRESENT INVENTION > 0.18 |
| | 15.21 | 49 | 0.3104 | |
| | 25.23 | 81 | 0.3115 | |
| | 8.41 | 49 | 0.1716 | CONVENTIONAL LED PACKAGES <= 0.18 |
| | 12 | 81 | 0.1481 | |

| FAMILY | SUBSTRATE AREA | OPTICAL AREA | LF/mm$^2$ OF SUBSTRATE AT MAX (E7/80CRI/85C) | LF/mm$^2$ OPTICAL AREA (DOME ONLY; E7/80CRI/85C) |
|---|---|---|---|---|
| LED PACKAGES ACCORDING TO INVENTION | 81 | 80.7 | 56 | 56 |
| | 49 | 44.4 | 69 | 76 |
| | 25 | 24.6 | 69 | 70 |
| | 12.25 | 11.9 | 115 | 119 |
| | 6.25 | 6.25 | 107 | 107 |
| CONVENTIONAL LED PACKAGE | 81 | 52.8 | 19 | 29 |
| | 49 | 33.2 | 28 | 41 |
| | 25 | 16 | 32 | 50 |
| | 12.25 | 7.35 | 36 | 59 |
| | 6.25 | 6.25 | 68 | 68 |

12-V CONFIGURATION

LIGHT EMITTING DIODES, COMPONENTS AND RELATED METHODS

CROSS-REFERENCE TO RELATED APPLICATIONS

This application claims priority to and is a continuation-in-part of U.S. patent application Ser. No. 14/575,805, filed Dec. 18, 2014, incorporated by reference herein in its entirety. This application also claims priority to and is a continuation-in-part of U.S. patent application Ser. No. 15/192,790, filed Jun. 24, 2016, incorporated by reference herein in its entirety.

TECHNICAL FIELD

The subject matter disclosed herein relates generally to light emitting diodes (LEDs), components, and related methods. More particularly, the subject matter disclosed herein relates to devices, components, systems and methods utilizing die placement and coating processes to improve emission patterns in multi-die LED components.

BACKGROUND

Light emitting diodes or LEDs are solid state devices that convert electrical energy into light. LEDs can be utilized in light emitter devices or components for providing different colors and patterns of light useful in various lighting and optoelectronic applications. Light emitter devices can include surface mount devices (SMDs) which can be mounted directly onto the surface of an underlying circuit component or heat sink, such as a printed circuit board (PCB) or metal core printed circuit board (MCPCB). SMDs can comprise bottom electrical contacts or leads configured to directly mount to the underlying circuit component. SMDs can be used in various LED light bulb and light fixture applications and are developing as replacements for incandescent, fluorescent, and metal halide high-intensity discharge (HID) lighting applications.

Manufacturers of LED lighting products are constantly seeking ways to reduce their cost in order to provide a lower initial cost to customers and encourage the adoption of LED products. Devices and components incorporating fewer raw materials at sustained or increased brightness levels are desired. Moreover, LEDs that produce light at optimal outputs and under enhanced performance, particularly while using the same or less power, are becoming more desirable.

Thus, despite the availability of various light emitter devices and components in the marketplace, a need remains for devices, components, and methods that can be produced quickly, efficiently, at a lower cost, and with improved performance characteristics.

SUMMARY

In accordance with this disclosure, substrate based LEDs, components, and related methods having improved manufacturability and customization are provided and described herein. Devices, components, and methods described herein can advantageously exhibit improved processing times, ease of manufacture, and/or lower processing costs. Devices, components, and related methods described herein can be well suited for a variety of applications such as personal, industrial, and commercial lighting applications including, for example, light bulbs and light fixture products and/or applications. In some aspects, devices, components, and related methods described herein can comprise improved (e.g., less expensive and more efficient) manufacturing processes and/or improved optical properties including consistent and uniform light emission and color.

Solid state lighting apparatuses, such as LEDs, systems, and related methods are provided. An example apparatus can comprise, for example: a submount; a plurality of LEDs each electrically connected to one or more electrically conductive traces; and a phosphor layer or other color conversion component. LED devices as disclosed herein can be configured to control the gap between LEDs on a submount to thereby improve light emission and output characteristics.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which.

DETAILED DESCRIPTION

Figure 1:
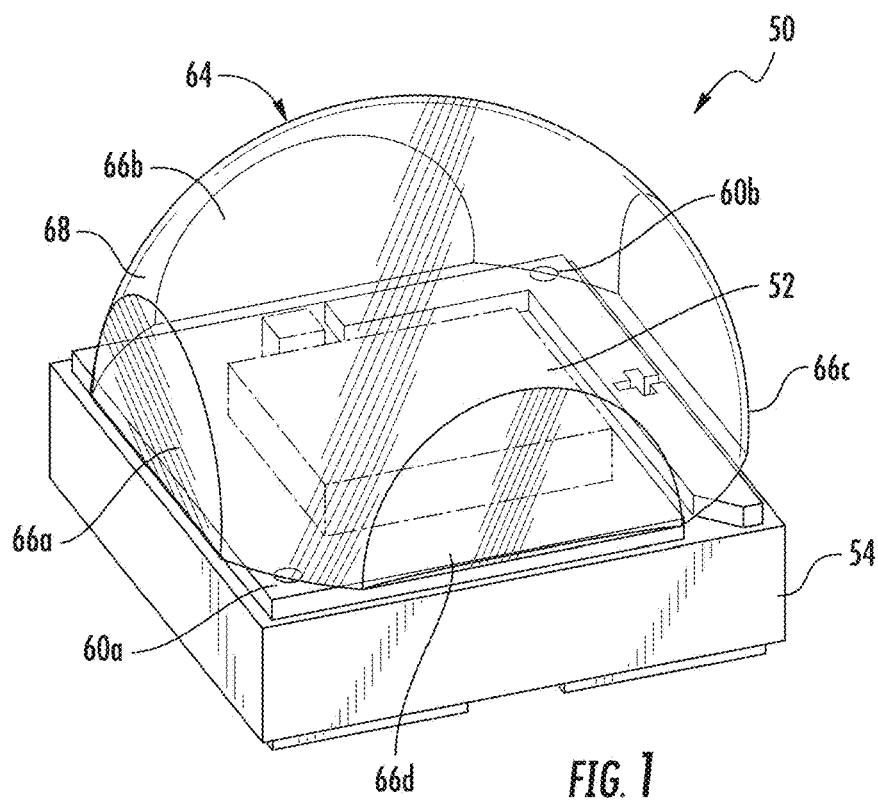
FIG. 1 is a perspective view of one embodiment of an LED package according to the present disclosure.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising," "including," and "having" as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and " emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LEDs or laser chips fabricated on a silicon, silicon carbide, sapphire, or III-V nitride growth substrate, including (for example) LEDs manufactured and sold by Cree, Inc. of Durham, N.C. Such LEDs and/or lasers can be configured to operate such that light emission occurs through the substrate in a so-called "flip chip" orientation. Such LED and/or laser chips can also be devoid of growth substrates (e.g., following growth substrate removal). In some cases, LEDs can comprise red-III-V chips, but not nitride such as InGaAlP, GaAsP, and the like.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918, 497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to different embodiments of LED package structures having a light source that comprises LEDs. The LED packages can be arranged in different ways and are relatively small, while at the same time are efficient, reliable and cost effective. The embodiments according to the disclosure herein can have different shaped encapsulants, but can emit with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

In some embodiments, the LED packages can have encapsulants with planar surfaces that result in a certain amount of light experiencing total internal reflection (TIR) within the encapsulant. Using planar surfaces can provide increased flexibility in the different shapes that can be used beyond conventional hemispheric lenses that are typically arranged to minimize TIR light, and the use of planar surfaces can allow for more compact LED packages. Some embodiments can comprise one or more LEDs on a submount with contacts and traces for applying an electrical signal to the one or more LEDs. The LED and the surface around the LED can be blanketed by a layer of phosphor material. In some embodiments the encapsulant can comprise a transparent material that is in a cubic or generally cubic shape over the LED and the submount. The conversion material layer can be of the type that converts light from the LED to another color or wavelength of light, and the conversion layer can be of a thickness and concentration such that less than all of the LED light is converted on its first pass through the conversion material.

Different LED packages according to the disclosure herein can have different shaped encapsulants to produce the desired emission profile and emission efficiency. Some embodiments can comprise encapsulants where not all of the surfaces are planar, with some comprising a hybrid combination of planar and curved surfaces. Some of these embodiments can comprise one or more LEDs mounted on a submount, with the encapsulant having an upper curved surface and planar side surfaces. The upper surface can have a radius of curvature that is greater than half the length or width of the submount, with the planar surfaces comprising truncated sections of the encapsulant so that the encapsulant does not overhang the edge of the submount. This can result in planar surfaces with a curved edge as described below. LED packages with planar encapsulants and planar/curved encapsulants are fully described in U.S. patent application Ser. No. 13/957,290, entitled "LED Package with Encapsulant Having Curved and Planar Surfaces," which is incorporated herein by reference in the entirety.

The disclosure herein can in some embodiments be directed to a number of different features and arrangements that can improve or tailor the emission characteristics of LED packages according to the disclosure herein. These can include, but are not limited to, improved phosphor layer compositions and coverage, the use of particular silicones in different layers, the grouping of LEDs, a truncated (or cubic) encapsulant, spacing between a plurality of LEDs, the arrangement of phosphor layers, and/or improved coverage of reflective layers. In some embodiments, the use of some or all of these features can result in LED packages emitting light at improved lumen density.

The disclosure herein is described herein with reference to certain embodiments, but it is understood that the disclosure herein can be embodied in many different forms and should not be construed as limited to the embodiments set forth herein. In particular, the disclosure herein is described below in regards to certain LED packages having LEDs in different configurations, but it is understood that the disclosure herein can be used for many other LED packages with other LED configurations. The LED packages can also have many different shapes beyond those described below, such as rectangular, and the solder pads and attach pads can be arranged in many different ways. In other embodiments, the emission intensity of the different types of LEDs can be controlled to vary the overall LED package emission.

The disclosure herein can be described herein with reference to conversion materials, wavelength conversion materials, remote phosphors, phosphors, phosphor layers and related terms. The use of these terms should not be construed as limiting. It is understood that the use of the term "remote phosphors", "phosphor", or "phosphor layers" is meant to encompass and be equally applicable to all wavelength conversion materials.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Figure 2:
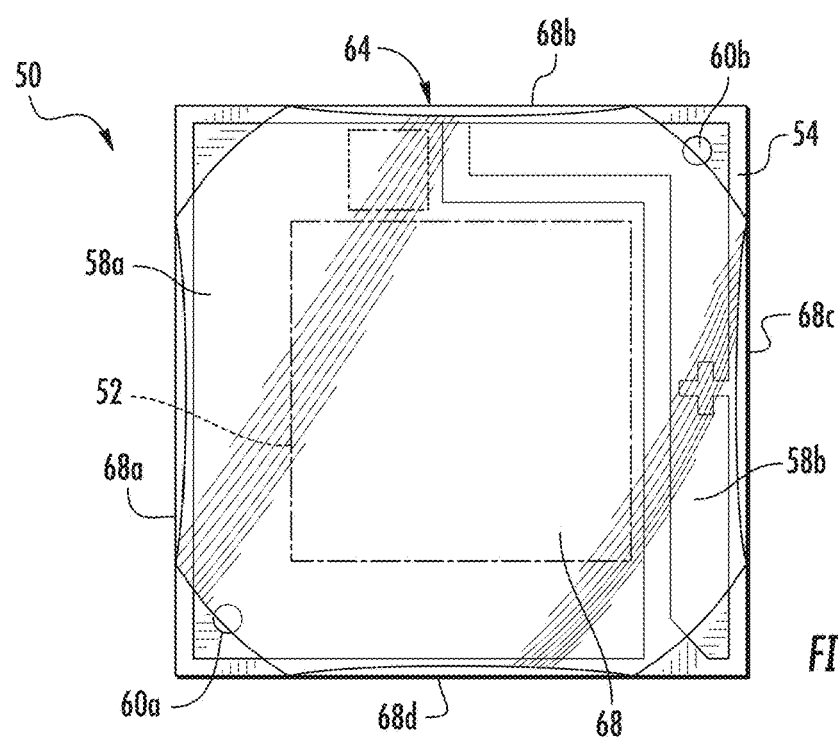
FIG. 2 a top view of the LED package shown in FIG. 1.
Figure 3:
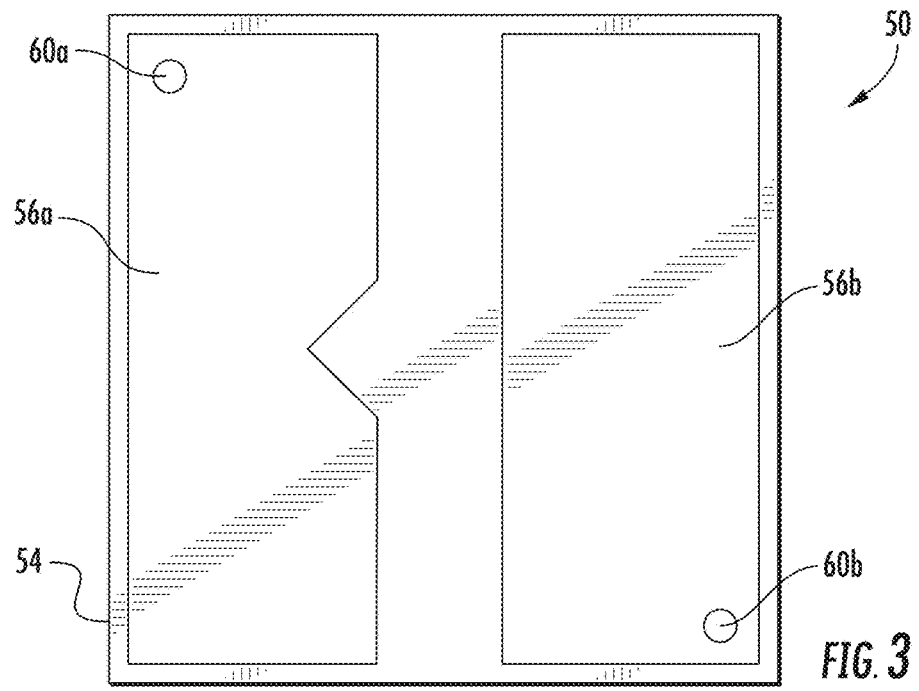
FIG. 3 is a bottom view of the LED package shown in FIG. 1.

FIGS. 1-3 show one embodiment of an LED package 50 according to the disclosure herein having a single emitter and an encapsulant with curved and planar surfaces. This is only one of the many different LED packages that can use the features of the disclosure herein and the features are described in U.S. patent application Ser. No. 13/957,290, which is incorporated above. The package 50 has a generally square footprint and can comprise an LED chip 52 mounted on a submount 54. The LED package 50 also comprises first and second bottom contact/solder pads 56a, 56b on the bottom of the submount 54. First and second die attach pads 58a, 58b can be included on the top surface of the submount 54 and first and second conductive vias 60a, 60b are included that pass through the submount 54 between the die attach pads 58a, 58b and the solder pads 56a, 56b. The LED chip 52 and submount 54 can comprise any of the devices and materials described above and can be arranged in many different ways. The pads and vias can similarly be made of different materials be arranged in the different way as those described in the incorporated patent application.

Some embodiments of the LED package can further comprise a conversion material layer (not shown) described below that covers the LED chip 52, and in some embodiments the conversion material layer can also cover the exposed surfaces of the die attach pads 58a, 58b, and exposed portions of the top surface of the submount 54. An encapsulant 64 is included over the LED chip 52, the attach pads 58a, 58b, and the submount 54. The conversion material layer can comprise any of the materials described in the above incorporated application and can be arranged in the different ways described therein. The encapsulant 64 can also comprise any of the materials described therein.

In LED package 50, the encapsulant 64 can comprise a combination of planar and curved surfaces. The embodiment shown comprises four side planar surfaces 66a-d and one curved surface 68, with the side planar surfaces being in alignment with the edges of the submount 54 and the remainder of the outer surface of the encapsulant 64 comprising the curved surface 68. The encapsulants according to the disclosure herein can comprise different curved and planar surfaces that can provide the desired package emission profile, such as a narrow package emission profile compared to packages with cubic encapsulants. The encapsulant can also provide the desired variation in CCT over a range of viewing angles.

The encapsulants according to the disclosure herein can have many different dimensions of planar and curved surfaces as described in the above application. This combination of planar and curved surfaces allows for the LED package 50 to maintain its relatively small footprint while also utilizing an encapsulant with a larger radius of curvature. In some embodiments, less light experiences TIR at the curved surface, thereby reducing the amount of light recycling compared to LED packages with cubic encapsulants. Some light may experience TIR at the planar surfaces, but there can be an overall reduction in TIR that can contribute to the LED package emitting a more focused or narrow emission profile.

Figure 4:
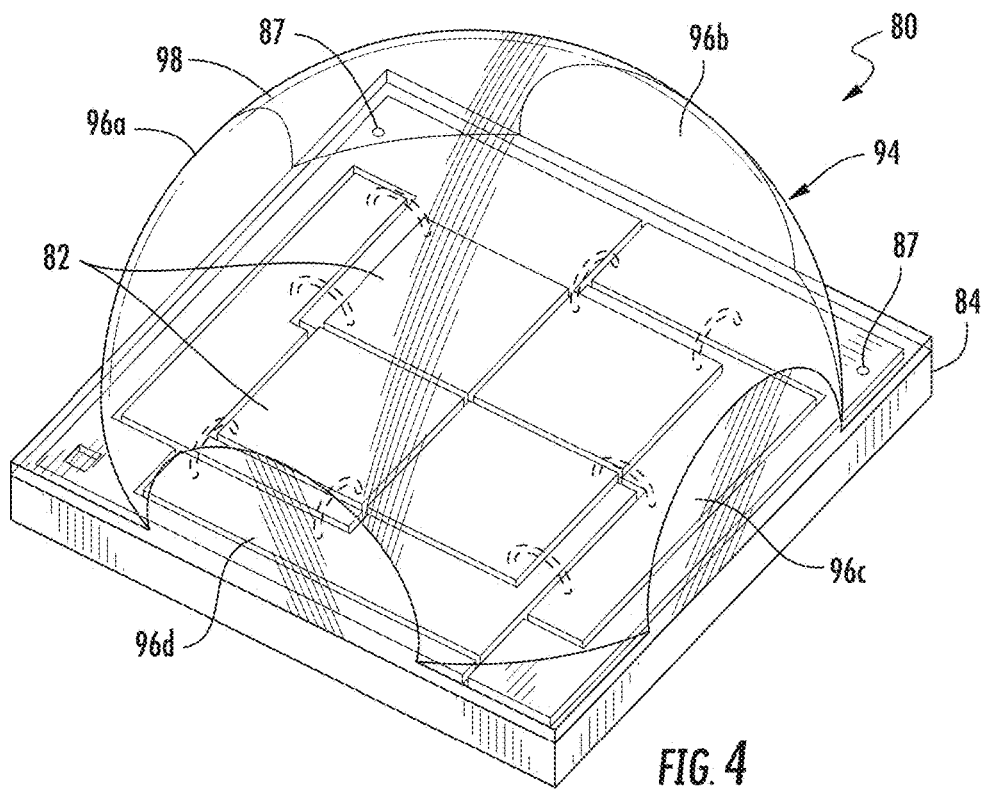
FIG. 4 is a perspective view of another embodiment of an LED package according to the present disclosure.
Figure 5:
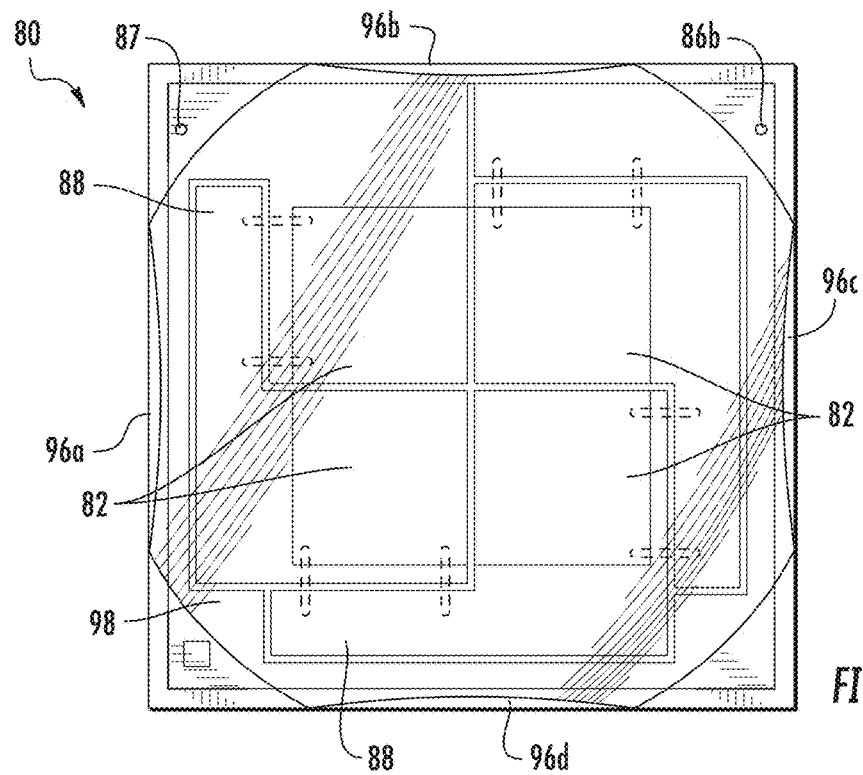
FIG. 5 a top view of the LED package shown in FIG. 4.
Figure 6:
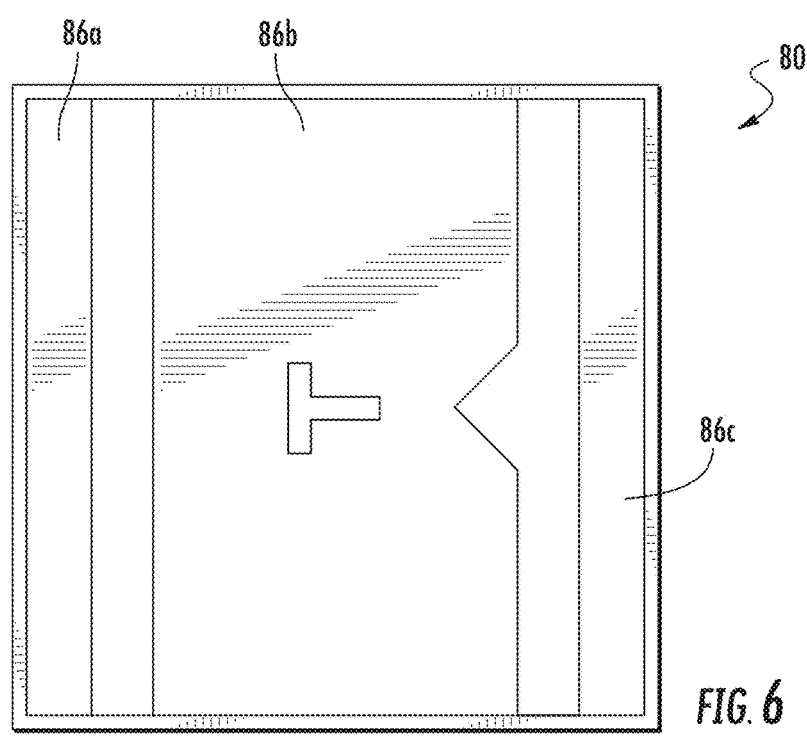
FIG. 6 is a bottom view of the LED package shown in FIG. 4.

FIGS. 4-6 show another embodiment of an LED package 80 according to the disclosure herein that also comprises a submount 84 with bottom contacts 86*a-c* and conductive vias 87. The LED package also includes an encapsulant 94 with planar surfaces 96*a-d* and a curved surface 98. In this embodiment, the LED package 80 comprises a plurality of LEDs 82 with a corresponding increase in the number of die attach pads 88. The embodiment shown comprises four LEDs 82 and four or more die attach pads 88. LEDs 82 can be used including commercially available chips such as the EZ family chips available from Cree, Inc. Other LEDs can also be used including those commercially available from Cree Inc., under its DA, GaN, MB, RT, TR, UT, and XT families of LEDs. The LEDs 82 can have different spaces between adjacent LEDs, with some embodiments having spacing in the range of 0-200 um, while other embodiments can have spacing in the range of 0-100 um. Still other embodiments can have spacing in the range of approximately 30-70 um.

The LED package 80 can also comprise a conversion material layer (not shown) as described below. It is understood that the disclosure herein can be applied to many different LED packages beyond those shown in the embodiments above, or shown in the above incorporated application.

The disclosure herein provides improvements over previously disclosed LED packages with planar surface encapsulants. One of the advantages of LED packages according to the disclosure herein is that they can have relatively large epitaxial (LED chip die) area per substrate (submount or panel) area. The different LED package embodiments of the disclosure herein can comprise encapsulants or domes with many different shapes and sizes, with some embodiments having truncated or cubic lenses. This truncated encapsulant arrangement, along with the type and size of emitters, allows for higher die area (i.e. the area covered by the emitter die) to panel area (i.e. the area covered by the LED chip submount or panel) ratios compared to conventional LEDs. That is, the die area for the LED packages according to the disclosure herein can cover more of the top surface of the submount/panel compared to conventional LED packages.

Figures 7, 8:
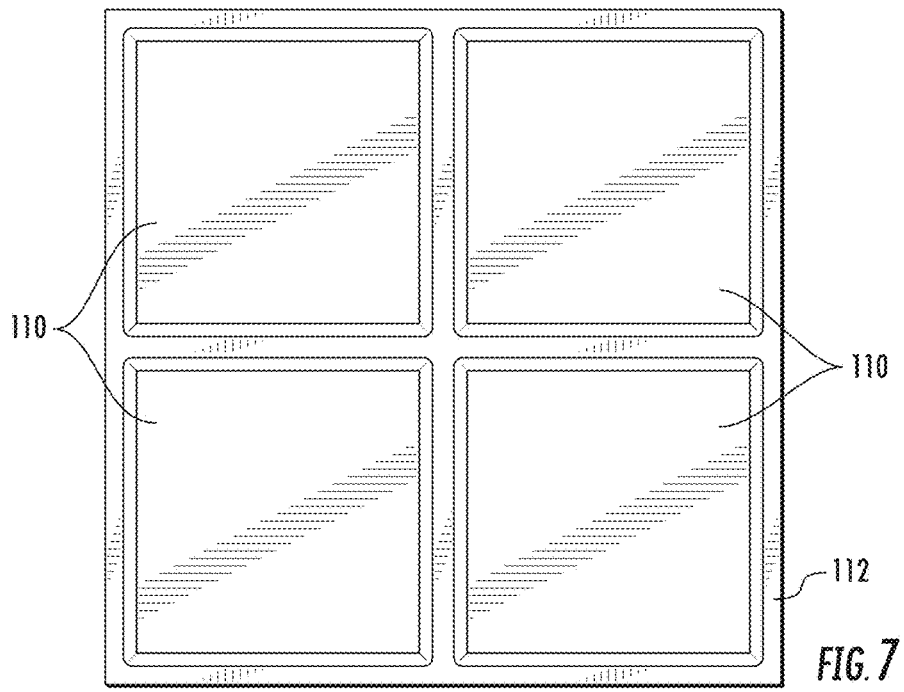
FIG. 7 is a top view of multiple LEDs that can be used in LED packages according to the present disclosure.
FIG. 8 is table showing the die to submount area ratios for conventional LED packages compared to LED packages according to the present disclosure.

The disclosure herein also provides for a number of improvements, including but not limited to improved die to panel ratios and improved phosphor coverage of adjacent LEDs in the LED packages having multiple LEDs. FIG. 7 shows one embodiment of the arrangement of four LEDs 110 that can be provided on a submount/substrate 112 in some LED packages according to the disclosure herein. Different LEDs can be used including commercially available chips such as the EZ family chips available from Cree, Inc., each of which can have two wire bond pads for electrical connection by wire bonds. Other LEDs can also be used including but not limited to those commercially available from Cree Inc., under its DA, GaN, MB, RT, TR, UT, and XT families of LEDs.

FIG. 8 is a table 120 showing the die to submount (also referred to as substrate or panel) area ratios for different LED package types according to the disclosure herein, compared to conventional LEDs. For conventional single LED chip packages 122, the ratio of die area to panel area ratio can be less than 0.430. For some embodiments of single chip LED packages 124 according to the disclosure herein, the ratio of die to submount area can be greater than 0.431. In other embodiments, the ratio can be greater than 5, while in other embodiments it can be greater than 6 or 7. Referring again to FIG. 8, for conventional multichip LED packages 126 the die to submount area ratio is typically less than 0.18. For multiple chip LED packages according to the disclosure herein 128, the die to submount area ratio can be greater than 0.18. In other embodiments the ratio can be greater than 2 or greater than 3, while in other embodiments the ratio can be greater than 4. Different factors can contribute to the improved ratios, including but not limited to the truncated lens with planar surfaces.

Different embodiments of the disclosure herein can have the phosphor layers that are deposited as a sprayed coating with relatively high percentage of one or more solvents. The solvents can then be evaporated away (such as by heat or air drying) to leave the desired phosphor and binder layer. The resulting phosphor layer can have a relatively high phosphor to binder ratio, with some embodiments having a ratio of 2 to 1, 3 to 1, 4 to 1 or greater than 4 to 1. In the embodiments where the ratio can be approximately 4 to 1, the result can be a high density phosphor layer on the LEDs, with a corresponding high density phosphor layer between the multiple LEDs and on one or more, or all sides, of the LEDs.

The high density phosphor layer can provide the further advantage of improved thermal management for the LED packages according to the disclosure herein. The thickness of the high density phosphor layer can be half, a third, or less, than the thickness of lower density phosphor layers. For example, some embodiments of LEDs can have a high density layer in the range of 40 to 50 um thick, while lower density layers can be in the range of 120 to 150 um thick. By having a thinner phosphor layer with dense phosphor material, less heat is trapped in the phosphor layer and heat generated by the phosphor can more easily radiate into the die or submount where it can dissipate.

Figure 9:
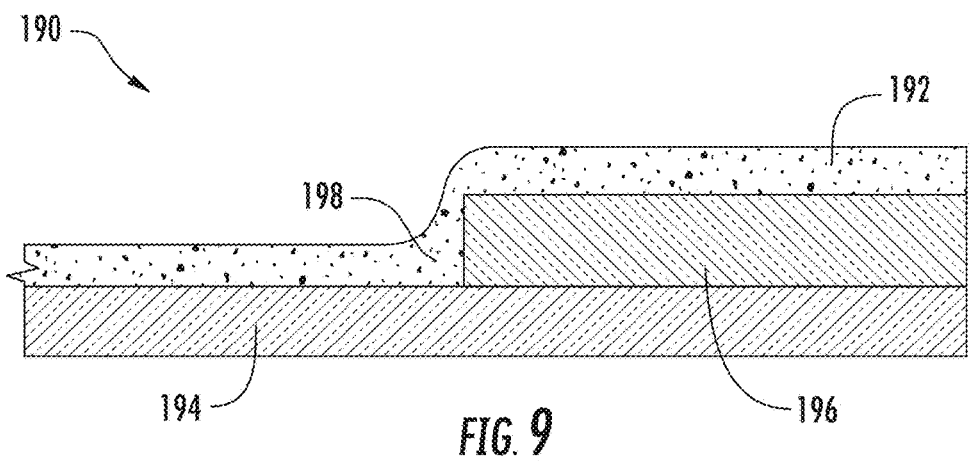
FIG. 9 is a side view of another LED package according to the present disclosure.
Figure 10:
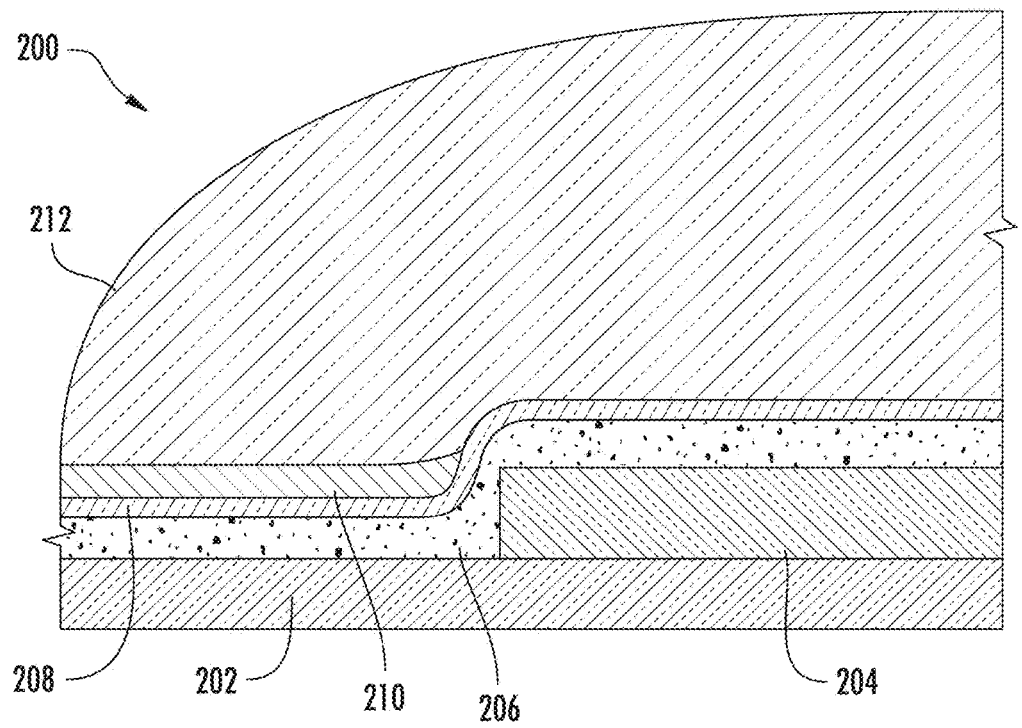
FIG. 10 is a side view of still another LED package according to the present disclosure.

The disclosure herein also provides for more controlled and reliable formation of phosphor layers. A conventional LED package with a phosphor layer can be interrupted at the edge of the LED chip with the edge of the LED chip protruding partially or fully through the phosphor layer. FIG. 9 shows another embodiment of an LED package 190 according to the disclosure herein that comprises a phosphor layer 192 having a smooth surface that creates a ramp from the submount 194 to the top surface LED chip 196. This ramp forms a "fillet" portion 198 of the phosphor layer 192 at the corner of the submount 194 and LED chip 196 that forms to the top of the chip. This fillet portion 198 provides uniform phosphor layer coverage over the LED chip 196 and can be useful in the controlled formation of a reflective layer (as shown in FIG. 10 below). The smooth surface also allows for the surface tension to hold the reflective layer material (e.g. $TiO_2$ in silicone) to prevent it from covering the LED chip. In some embodiments, the surface of the fillet portion can be curved, with some embodiments having a concave fillet portion. The can result in a graded thickness to the edge of the LED chip 196 to ensure full coverage of the LED chip, and in particular the edges of the LED chip. This gradient in thickness can result in the curved surface from the area surrounding the LED chip 196 to the edge of the edge of the LED chip 196. In other embodiments, the surface of the fillet portion can be straight. Accordingly, the gradient in thickness for the fillet can also be provided along at least a straight portion of the fillet surface. As such, curved and/or straight embodiments can provide the thickness gradient.

In conventional LED packages having a rough surface with large variations in surface topology, small openings between the surface features can promote wicking of the reflective layer material. This wicking can cause the reflective layer to cover the phosphor layer and to continue to cover the top of the LED chip where it can interfere with emission. In some embodiments according to the disclosure herein, these rough surfaces can be made smooth using a spray/dispense of a silicone/solvent mixture deposited over the roughened surface. After cure, the top surface of the silicone layer will be smooth, which can reduce the reflective layer material wicking. This helps prevent the reflective layer from covering the LEDs. It is understood that the smoothing layer can generally comprise a thin layer or film of material. The embodiments according to the disclosure herein have a smoothing layer that is much thinner than any subsequent encapsulation layers, with the smoothing layer functioning primarily as a surface treatment. In some embodiments the smoothing layer can be less than 1/5 the thickness of any subsequent encapsulation layers. In other embodiments it can be less than 1/10 the thickness, while in other embodiments it can be less than 1/20, 1/50 or 1/100 the thickness.

FIG. 10 shows one embodiment of an LED package 200 with this additional smoothing layer that can comprise many different materials, with a suitable material being silicone-based as described above. The LED package 200 can comprise a submount 202, with an LED chip 204 mounted on the submount's top surface. As described above, many different LEDs can be used with the embodiment shown comprising a blue emitter such as a blue emitting EZ LED chip from Cree, Inc. A silicone phosphor matrix layer 206 is included over the LED chip 204 and the top surface of the submount 202, with the phosphor layer 206 comprising a phosphor material and binder such as methyl silicone "A". A smoothing silicone layer 208 can be included over the phosphor layer 206 that can also comprise methyl silicone "A". The thickness of the smoothing layer 208 can be between 0 and 30 mm, but layers of other thicknesses can also be used. This smoothing layer 208 can be arranged between the phosphor layer 206 and reflective layer 210, as well as between the phosphor layer 206 and the encapsulant (molding layer) 212. In some embodiments it comprises the same silicone as the phosphor layer 206, and in other embodiments it can comprise a different silicone. The reflective layer 210 is included between the smoothing layer 208 and the encapsulant 212, and in this embodiment the reflective layer 210 can comprise TiO$_2$ mixed in silicone. Different silicones can be used, with some embodiments comprising phenyl silicone "1". The encapsulant (lens or dome) 212 is formed over the reflective layer 210 and the exposed smoothing layer 208. In some embodiments the encapsulant 212 can be formed by an overmold process and in some embodiments it can comprise a methyl silicone "B". In the embodiment shown the encapsulant 212 does not comprise the same silicone as the phosphor layer 206 or smoothing layer 208, but in other embodiments it can comprise the same silicone.

The disclosure herein comprises other methods for providing the desired spread and wicking of the reflective layer. As mentioned above, roughness of the phosphor layer can promote undesirable wicking. When dispensing material (e.g. phosphor layer material) on a heated stage, solvents can flash boil. This can leave a rough surface. Dispensing this same material on a cold stage and then curing creates a smooth surface that allows for better control of the reflective material (TiO$_2$ mixed silicone). This allows for controlling the coverage of the reflective layer, particularly when depositing higher solvent ratio phosphor layers.

The silicone mismatch limits the reflective layer wicking to uniformly cover the die edges, but removing statically attached compounds also allows the reflective layer material to flow to cover the chip edges. Other features such as the wire bonds can also facilitate wicking. As the reflective layer mixture spreads across the surface of the phosphor layer, features like wires or die edges promote wicking around the feature, which can help direct the reflective layer material to cover the desired surface. There can be many different viscosities for the reflective layer, and as discussed above, the reflective layer can comprise many different materials. In some embodiments the reflective layer that is deposited on the phosphor layer can comprise a TiO$_2$/silicone/solvent having a viscosity in the range of 25-100 Pas.

Embodiments of the disclosure herein can also be arranged to provide more reliable bonding or coupling of the layers to provide a more reliable LED package. In some embodiments, a more robust and reliable chemical bond can be formed between layers. This can result in an improvement over conventional packages where the layers can more easily be separated from each other, such as in the case where they break cleanly from one another. Different processes can be used to create this chemical layer bond, with some embodiments allowing for the formation of one layer over another before one or more of the layers below are fully cured.

This chemical bond can be formed between many different layers in LED packages according to the disclosure herein. In some embodiments, a reflective layer can be included over a portion of the LED package, such as over the phosphor layer around and/or between the LEDs. Referring again to the LED package 200 shown in FIG. 10, the reflective layer 210 can comprise many different materials, such as TiO$_2$ in silicone. The molded encapsulant 212 can then be formed over the top surface of the phosphor layer 206 and the reflective layer 210, with a chemical bond between the encapsulant 212 and reflective layer 210. In some embodiments this chemical bond can be formed by molding the encapsulant 212 over the reflective layer 210 before the silicone in the reflective layer 210 is fully cured. This arrangement is particularly applicable to layers having different types of silicone. For example, this arrangement can be used when one layer comprises a phenyl silicone and the other comprises a methyl silicone. In some embodiments, the reflective layer 210 can comprise TiO$_2$/silicone with a phenyl silicone while the encapsulant 212 can comprise a methyl silicone. To form a chemical bond between the two, the methyl silicone encapsulant 212 can be bonded over the reflective layer 210 before the phenyl silicone is cured. It is understood that other embodiments can comprise different types of materials in the different layers and in some embodiments the reflective layer 210 can comprise methyl silicone and the encapsulant 212 can comprise phenyl silicone.

Figure 11:
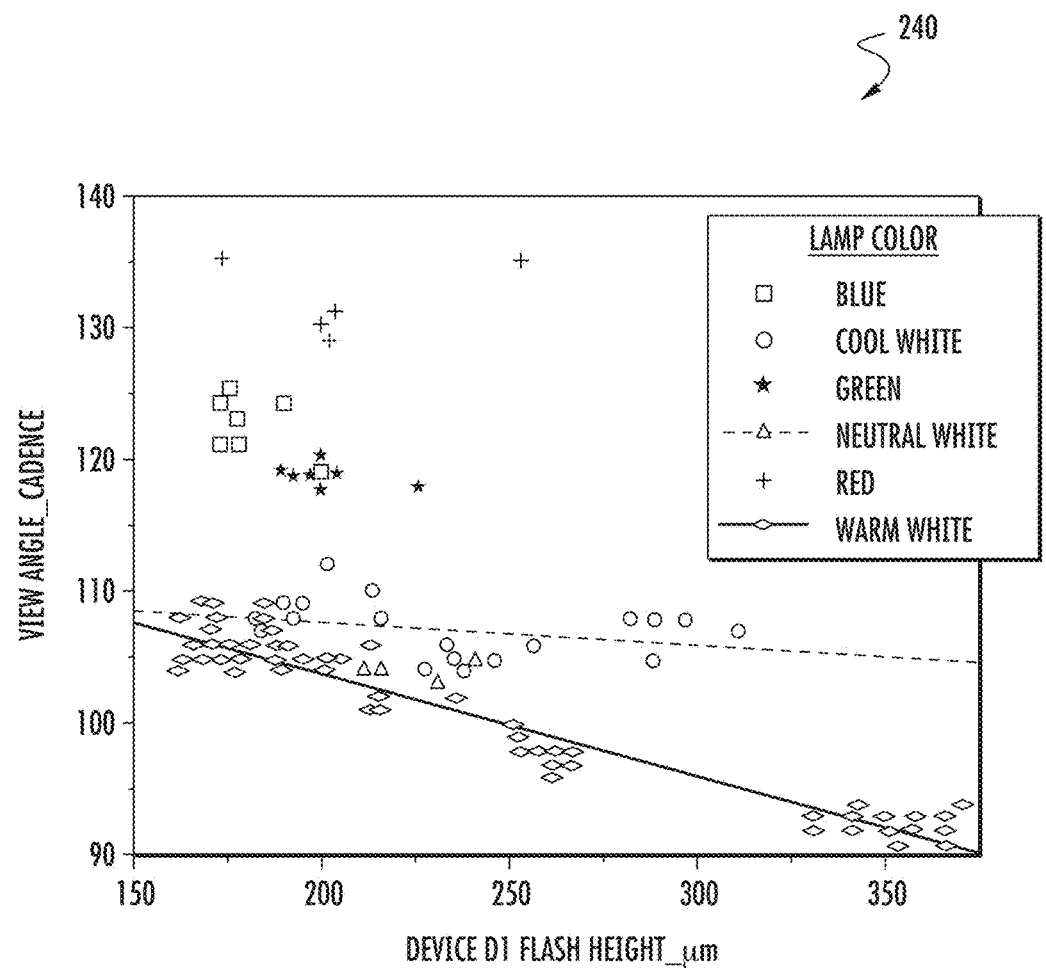
FIG. 11 is a graph showing the emission characteristics of different LED packages according to the present disclosure, at different flash heights.

Referring to FIGS. 1-6, the encapsulants 64, 94 in the different embodiments can include a portion at the corners of the submount that remains from the encapsulant overmold process. This corner portion of the encapsulant is referred to as the "flash" portion, and different embodiments can have a different flash height or thickness. In some embodiments, increasing the flash height can increase the distance from the LED emitting surface to the center of the lens, which can change the LED package emission pattern. Generally speaking, the farther the emitting surface is from the center of the lens. the smaller the viewing angle. The inverse is also generally applicable, and the closer the emitting surface is to the center of the lens. the greater the viewing angle. Brightness is also a function of flash height, and generally the thinner the flash height, the brighter the part will measure. In different embodiments, the flash height can be optimized to obtain proper viewing angle without sacrificing too much brightness. FIG. 11 is a graph 240 showing the different emission characteristics for one embodiment of an LED package according to the disclosure herein with different flash heights, and in particular the warm and cool white emissions based on flash height. This is only one of the many encapsulant dimensions that can be changed to alter package emission characteristics.

Figures 12, 13:
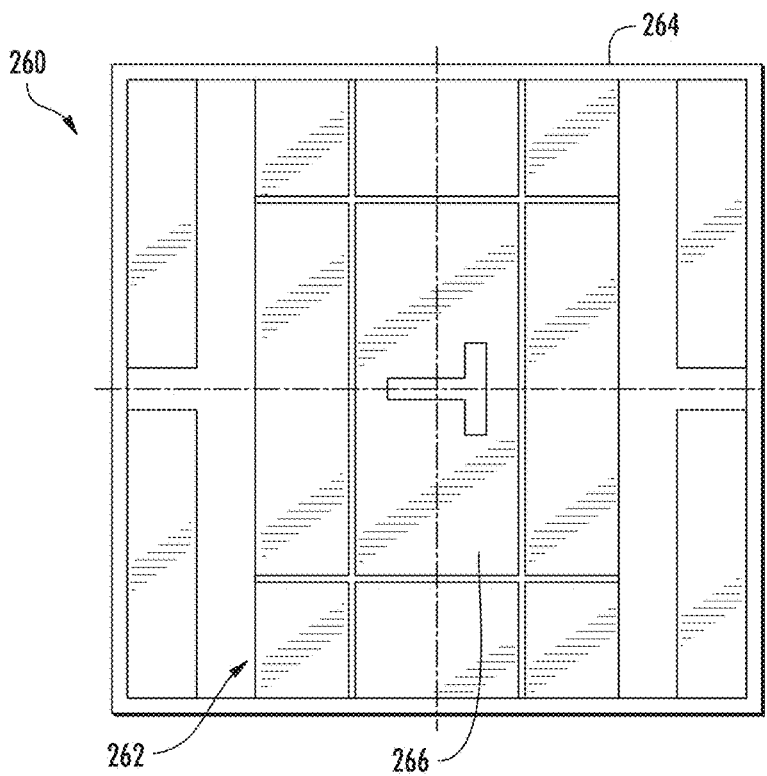
FIG. 12 is a graph showing luminous intensity of conventional LED packages and LED packages according to the present disclosure
FIG. 13 is a backside view of an LED package according to the present disclosure.

One, some, or all of the different features described can be utilized in LED package embodiments according to the disclosure herein. By utilizing the features described above, such as the particular silicones in different layers (e.g. methyl for phosphor layer and encapsulant), the grouping of LEDs (four as shown), and the dense phosphor layer, the different embodiments can provide improved lumen density per submount and/or optical area. There can be many different classes of emission density at a particular maximum current. FIG. 12 shows a graph 250 that divides different LED packages according the disclosure herein into three general classes based on light source size:

1. For source sizes greater than 49 mm$^2$, the lumen density can be in excess of 50 lm/mm$^2$. Conventional similar LED packages with same source sizes are believed not to exceed 35 lm/mm$^2$.

2. For source sizes between 25 and 49 mm$^2$, the lumen density can be excess of 70 lm/mm$^2$. Conventional similar LED packages with the same source sizes do not exceed 50 lm/mm$^2$.

3. For source size less than 25 mm$^2$, lumen density can be greater than 100 lm/mm$^2$. Conventional similar LED packages with the same source size did not exceed 70 lm/mm$^2$.

It is understood that these devices can be divided into many other classes. Some of these embodiments can use a truncated (or cubic) dome, which allows for the substrate and encapsulant (dome) to have nearly the same size and/or footprint. Conventional technologies can use a full dome that is smaller than the substrate area. This can be one factor in the difference of lumen density with convention LED packages.

Some embodiments of the disclosure herein can emit light with a luminous intensity up to 2546 lumens at 19 watts from a 5.0×5.0 mm package. Other embodiments can emit up to 4022 lumens at 32 watts from a 7.0×7.0 mm package. Some of these embodiments can be provided in 2-step and 3-step bins for color temperatures of 3500K through 2700K in 80 and 90 CRI.

The LED packages according to the disclosure herein are arranged to allow for operation at different voltages, such as at 6/12V operation. Embodiments of the disclosure herein can also be arranged to operate at other voltages, such as at 18/36V operation, and can be arranged to operate at more than two voltages. Some of these embodiments can use multiple solder points to improve thermal performance by reducing solder voids. Multiple voltage LED packages are described in U.S. patent application Ser. No. 14/286,344, to Wilcox, which is entitled "Multiple Voltage Light Emitter Packages, Systems and Related Methods" and is incorporated herein by reference.

FIG. 13 shows another embodiment of the backside of an LED package 260 according to the disclosure herein that can comprise an optional waffle-like contact pattern (grid of many small squares) 262 on the bottom surface of the submount 264 with no solder mask in between for the center thermal pad 266. In this embodiment the center thermal pad 266 can be neutral, however it has multiple pads without solder mask between them that can provide for channels of flux to boil off during solder reflow. This can help reduce the void formations that are common in large solder footprints. The channels in this embodiment can be 20-100 um wide and can be the full depth of the metal. In other embodiments, the channels do not need to be the full depth.

Figure 14:
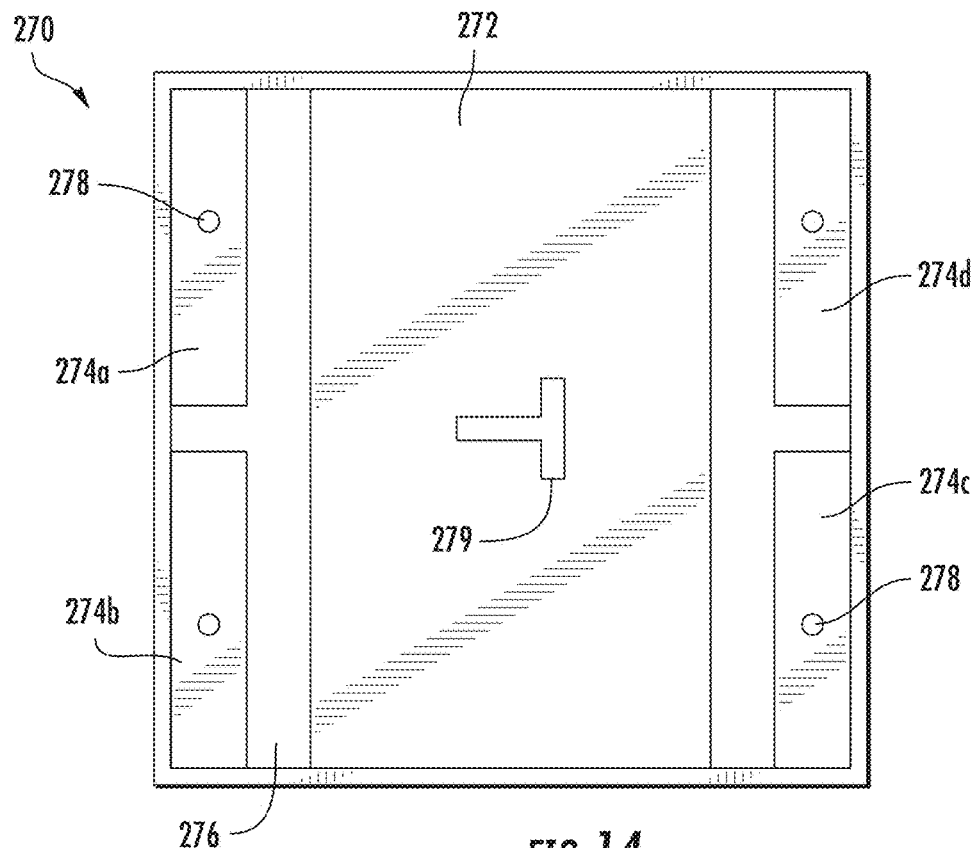
FIG. 14 is a backside view of another embodiment of an LED package according to the present disclosure.

FIG. 14 shows another embodiment of the backside of an LED package 270 according to the disclosure herein that can comprise center thermal pad 272 and contact pads 274a-d, all of which are arranged on the bottom of the submount 276 and cooperate with vias 278 for applying an electrical signal to the LEDs on the frontside of the submount 276. The center thermal pad 272 is primarily for conducting heat away from the LEDs to the mounting surface where it can dissipate. In other embodiments it can assist applying an electrical signal to the LEDs. The center thermal pad 272 can also comprise a polarity indicator 279 for indicating the polarity of the LED chip 270.

Figure 15:
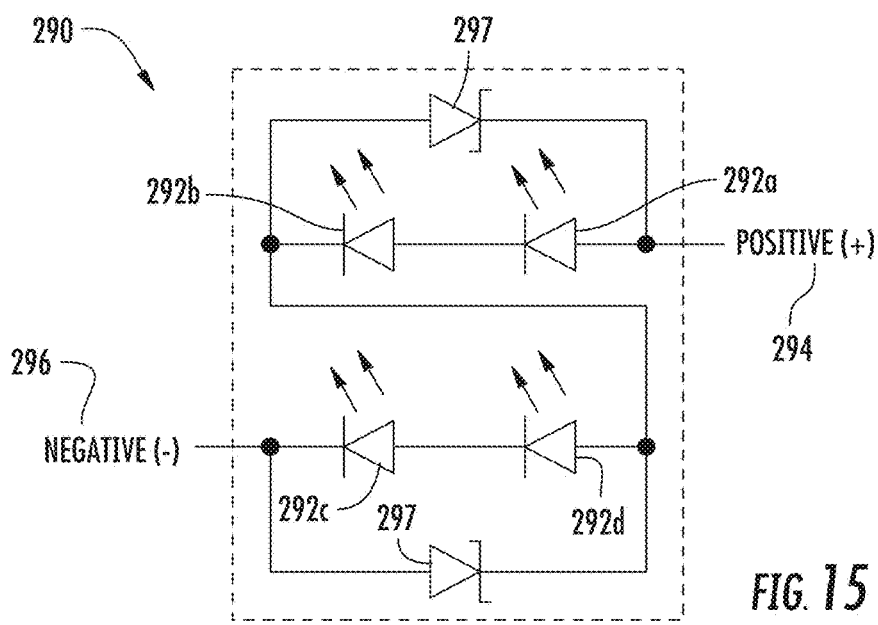
FIG. 15 is a schematic showing the interconnection of LEDs in one embodiment of an LED package according to the present disclosure.

As mentioned above, the LED chip 270 can be used for 6 volt and 12 volt operation, with the contact pads 274a-d and thermal pad 272 mounted on and electrically connected to different solder pads and interconnected in different ways to interconnect the LEDs in different ways. FIG. 15 shows a schematic of one embodiment of an LED chip 290 according to the disclosure herein having four LEDs 292a-d interconnected for 12 volt operation. The LEDs 292a-d are connected in series between the positive and negative terminals 294, 296. Each of the LEDs presents as approximately 3 volts to an electrical signal, with the LED chip operating at approximately 12 volts with the four series interconnected LEDs 292a-d. The LED package also has two zener diodes 297, each of which is connected in parallel with a respective two of the LEDs 292 to provide protection against damage from electrostatic discharge (ESD).

Figure 16:
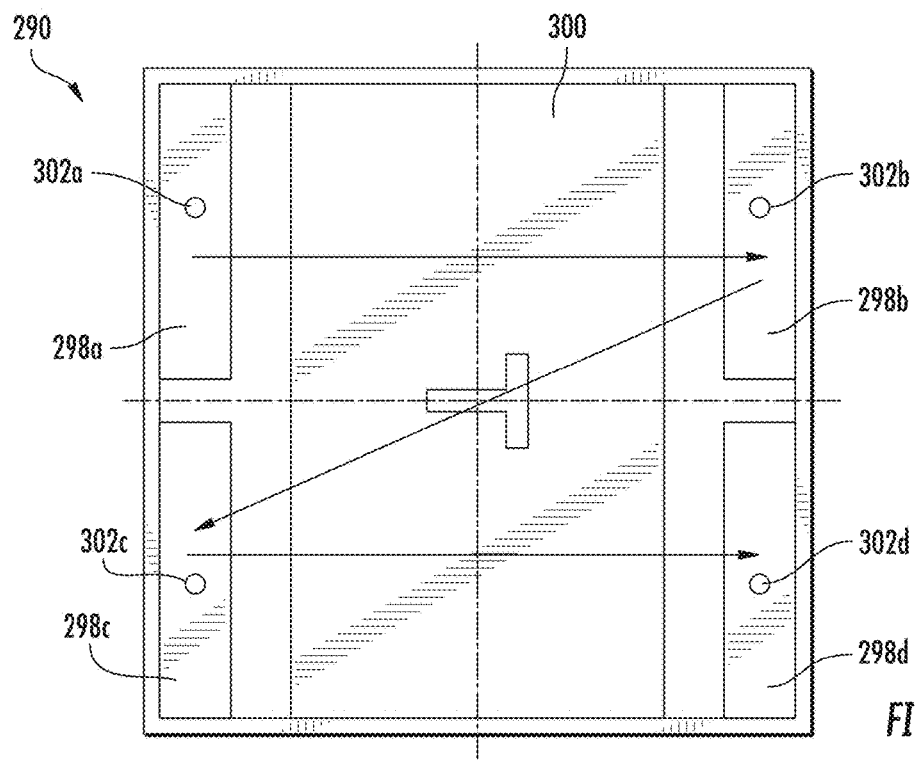
FIG. 16 is a backside view of another embodiment of an LED package according to the present disclosure.
Figure 17:
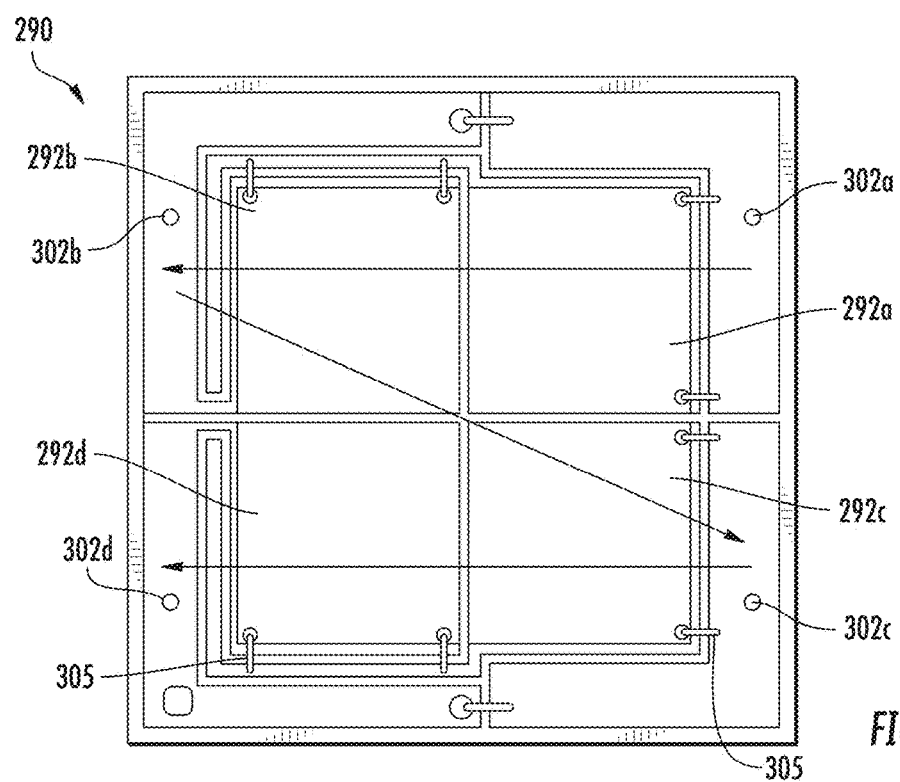
FIG. 17 is a frontside view of another embodiment of an LED package according to the present disclosure.

FIG. 16 shows the contact pads 298a-d and thermal pad 300 on the backside of the LED package 290 according to the disclosure herein. In some embodiments, the thermal pad 300 can be electrically isolated and used primarily for thermal management as described further below. In the LED package 290, however, the thermal pad 300 is used for both thermal management and for interconnecting the LEDs 292a-d. In LED package 290 the thermal pad 300 assists in conducting an electrical signal to the LEDs 292a-d to interconnect them as shown in FIG. 15. FIG. 17 shows the LEDs 292a-d on the frontside of the LED package 290 and the path for an electrical signal through the LEDs 292a-d.

The operation of the LED package 290 is discussed with reference to FIGS. 16 and 17. The desired electrical signal is applied to the first contact pad 298a and is conducted through the first via 302a to the first LED chip 292a on the frontside of the LED package 290. The signal is then conducted through the first LED chip 292*a* to the next serially connected second LED chip 292*b*. From the second LED chip 292*b*, the electrical signal passes through the second vias 302*b* to the second pad 298*b* on the backside of the LED package 290. From there the electrical signal is conducted across the thermal pad 300 and to the third contact pad 298*c* by a solder pad as described below. The signal is then again conducted to the frontside of the LED package 290 through the third vias 302*c*, and to the third LED chip 292*c*. This arrangement effectively connects the third LED chip 292*c* in series with the second LED chip 292*b*. The signal is then conducted from the third LED chip 292*c* to the fourth of the serially connected LEDs 292*d*. Following the fourth LED chip 292*d*, the signal passes through the fourth via 302*d* and again to the backside of the LED package 290 and the fourth contact pad 298*d*. To interconnect the LEDs 292*a-d* in series as described herein, the solder pad interconnects the contact pads 298*a-d* and thermal pad 300 to allow for the electrical signal to conduct between the LEDs on the frontside, and the second and third contact pads 298*b*, 298*c* on the backside. It is understood that conventional wire bonds 305 can be included on the frontside of the LED package 290 to interconnect the LEDs 292*a-d* and die attach pads in the desired manner.

Figure 18:
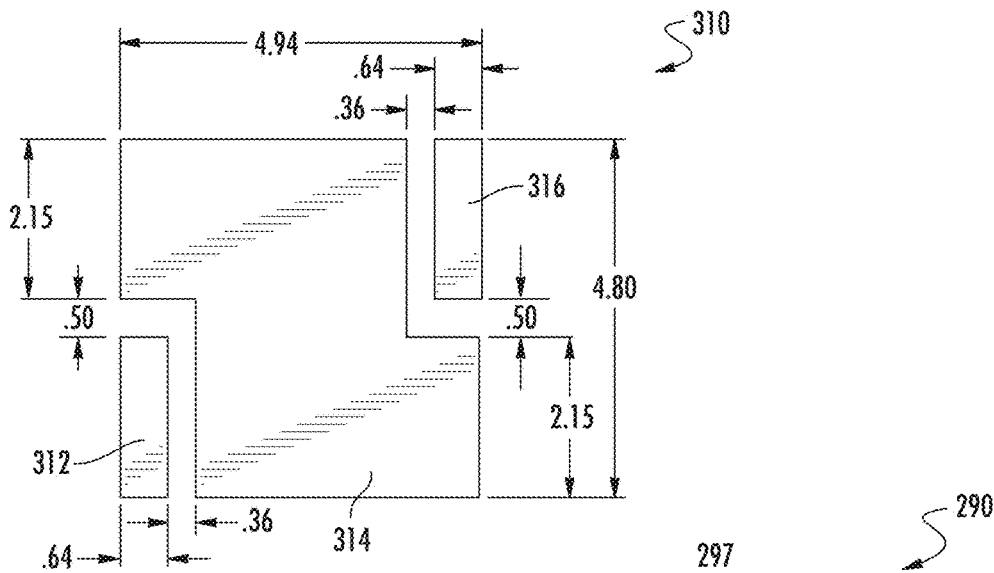
FIG. 18 is a layout of one embodiment of solder pads that can be used with LED packages according to the present disclosure.

Many different solder pad arrangements can be used to cause this type of series interconnection, and FIG. 18 shows one embodiment of one such solder pad pattern 310 according to the disclosure herein. FIG. 18 is described with reference to the features shown in FIGS. 16 and 17. The first solder pad 312 is electrically connected to the first contact pad 298*a*. The z-shaped second solder pad 314 functions as "bridging" solder pad and is coupled to the second contact pad 298*b*, thermal pad 300 and the third contact pad 298*c*, and forms and electrical path between the second and third contact pad 298*c* and across the thermal pad 300. This solder pad 314 conducts the electric signal from the second contact pad 298*b* to the third contact pad 298*c*. Finally, the third solder pad 316 is electrically connected to the fourth contact pad 298*d*. The LED packages can be coupled to the solder pads using many known methods and materials.

Figure 19:
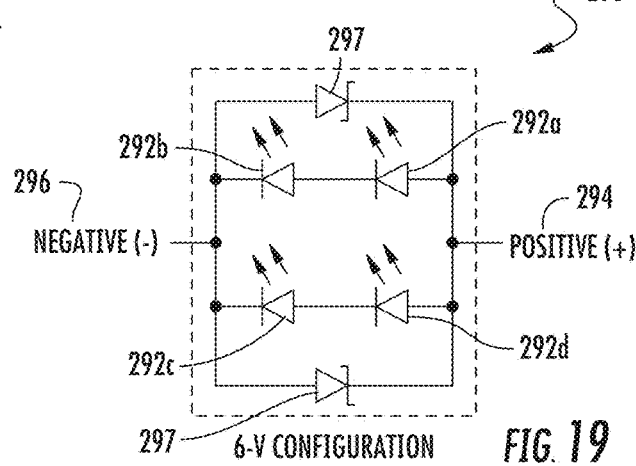
FIG. 19 is a schematic showing the interconnection of LEDs in one embodiment of an LED package according to the present disclosure.

As mentioned above, the LED packages according to the disclosure herein can operate at different voltages The LED chip 290 is described above as operating at 12 volts by having the LEDs 292 connected in series. The same LED chip can also operate at a different voltage by interconnecting at least some the LEDs in parallel. FIG. 19 shows another LED package 320 according to the disclosure herein that is similar to the LED package 290 and uses the same reference numbers. The LED package comprises four LEDs 292*a-d* that are interconnected between positive and negative terminals 294, 296. The package also comprises diodes 296 arranged for ESD protection. In this embodiment, the LEDs 292*a-d* are coupled in together with two sets of series connected LEDs arranged in parallel. First and second LEDs 292*a*, 292*b* are connected in series between the positive and negative terminals 294, 296, and the third and fourth LEDs 292*c*, 292*d* are connected in series between the positive and negative terminals 294, 296. The two sets of series connected LEDs are arranged in parallel between the positive and negative terminals such that a signal applied to LED chip at the terminals operates at 6 volts from the 3 volts presented by each of the series arrangements of two LEDs. To operate at this series/parallel combination, the contact pads and thermal pads are interconnected in a different way than the LED package 290 described above.

Figure 20:
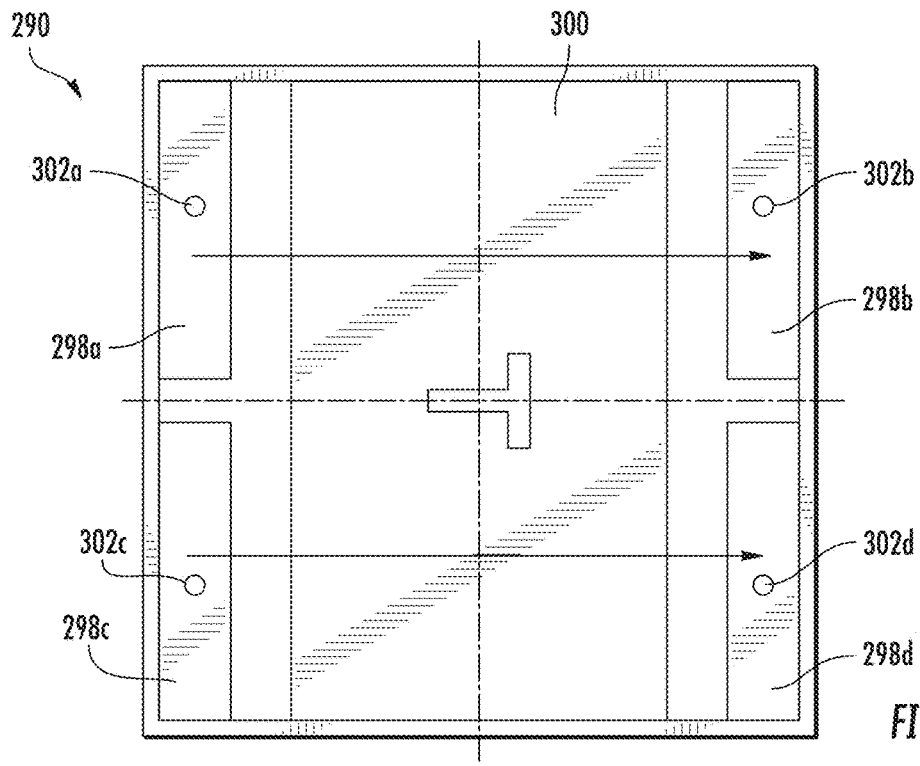
FIG. 20 is a backside view of another embodiment of an LED package according to the present disclosure.
Figure 21:
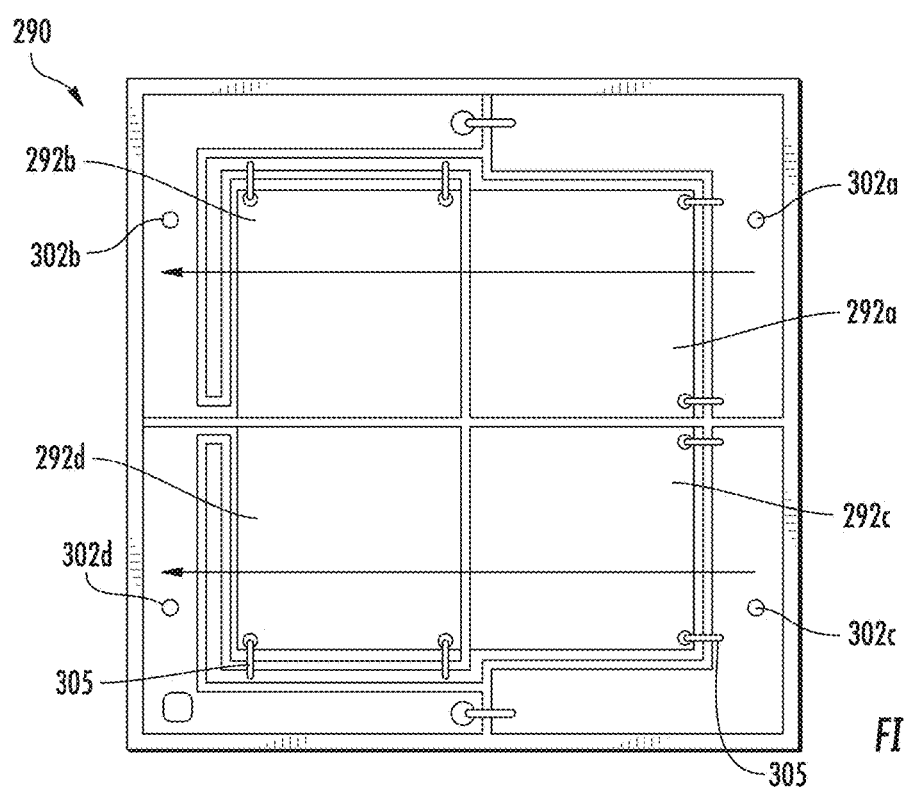
FIG. 21 is a frontside view of another embodiment of an LED package according to the present disclosure.

FIG. 20 shows the backside of LED package 320 having contact pads 298*a-d*, thermal contact pad 300, and vias 302*a-c*. In this embodiment, the thermal pad 300 is electrically isolated from the signal applied to the LED package 320, with the thermal pad 300 used primarily for thermal management. In this embodiment, the first and third contact pads 298*a*, 298*c* are coupled together by a solder pad, and second and fourth contact pads 298*b*, 298*d* are coupled together by a solder pad. Referring now to FIG. 21 and FIG. 20 together, a signal applied to the LED package 320 at the first and third contact pads 298*a*, 298*c* is conducted to the first and third LEDs 292*a*, 292*c* through the first and third vias 302*a*, 302*c*. The signal from the first chip 292*a* is conducted to its serially connected second LED chip 292*b*, and the signal from the third LED chip 292*c* is conducted to its serially connected fourth LED chip 292*d*. From the second and fourth LEDs 292*b*, 292*d* the signal is conducted to the second and fourth contact pads 298*b*, 298*d* through the second and fourth conductive vias 302*b*, 302*d*.

Figure 22:
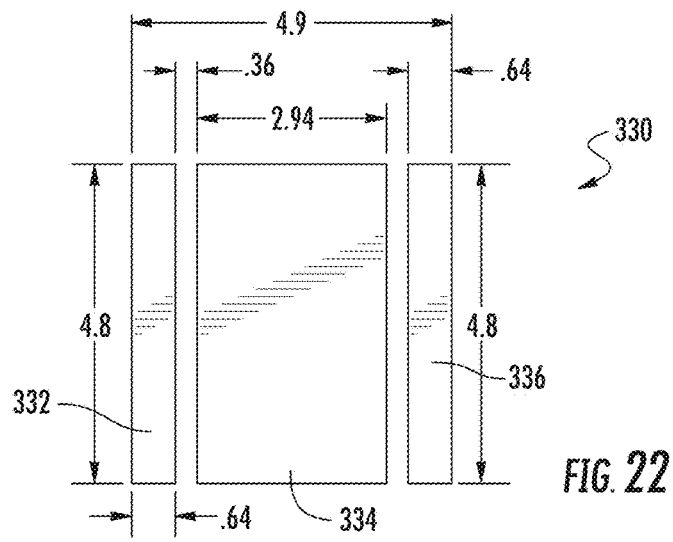
FIG. 22 is a layout of one embodiment of solder pads that can be used with LED packages according to the present disclosure.

Many different solder pad arrangements can be used to cause this type of interconnection, and FIG. 22 shows one embodiment of a solder pad pattern 330 according to the disclosure herein to provide the 6 volt interconnection. FIG. 22 is described with reference to the features shown in FIG. 20. The first solder pad 332 is arranged to be electrically connected to the first contact and third contact pads 298*a*, 298*c*, with the solder pad 332 also interconnecting the two contact pads. A central second solder pad 334 is coupled to the thermal pad 300 and is arranged to conduct heat from the thermal pad. It is noted the thermal pad 300 and second solder pad 334 are electrically isolated from the signal applied to the LED package 320. The third solder pad 336 is arranged to be electrically connected to the second and fourth contact pads 298*b*, 298*d*, and also interconnected to the two pads.

Figure 23:
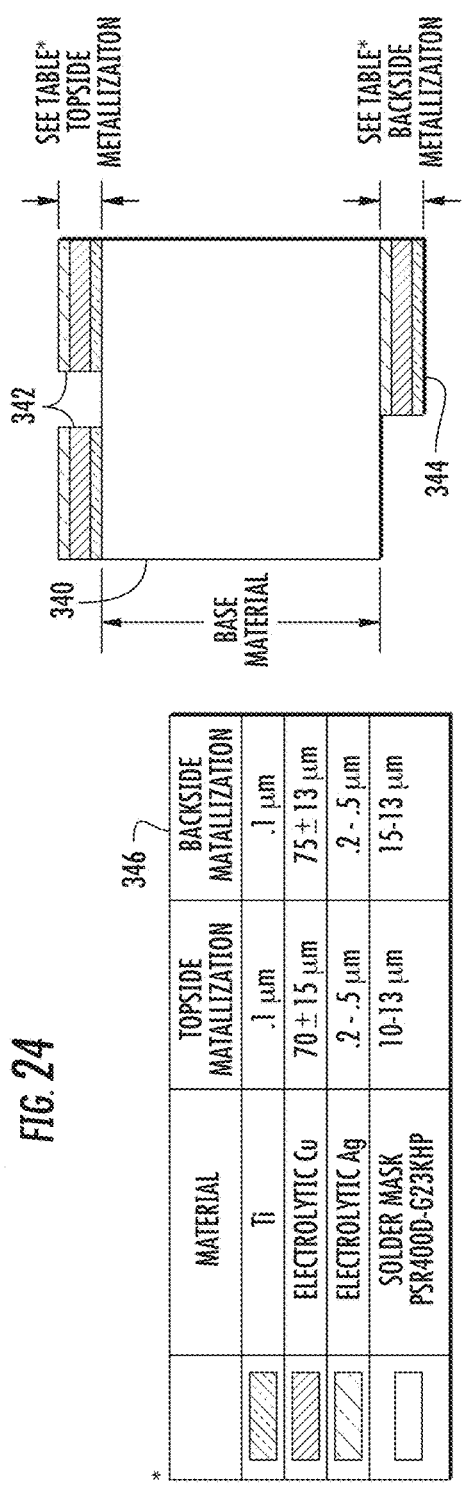
FIG. 23 is a side view and graph related to metallization that can be used in LED packages according to the present disclosure.

It is understood that the different embodiments according to the disclosure herein can comprise other improvements beyond those described above. The embodiments can comprise improved ratio of substrate to metallization thicknesses. Conventional substrates/submounts can be 0.5 mm thick can comprise 0.06 mm Cu metallization on the backside (and frontside). This has a nominal backside metal thickness to substrate thickness ratio of 8.3. In different embodiments according to the disclosure herein the backside metal thickness to substrate thickness can be the range of 1 to 6. In some embodiments, the substrate/submount can be 0.385 mm thick substrate, with a backside/frontside metal thickness of least 0.06 mm Cu (0.07 or 0.08 mm in other embodiments) to improve thermal performance. In these embodiments, the ceramic in the substrate can have a bigger impact on thermal conductivity because its thermal conductivity can be the lowest. By increasing the ratio of metallization (Cu) relative to the ceramic, the thermal resistance of the layer can be lower by transferring heat through the ceramic. FIG. 23 shows one embodiment of a base material 340 (substrate or submount), with frontside and backside metallization 342, 344, along with a graph 346 showing different thicknesses for the layers.

Figure 24:
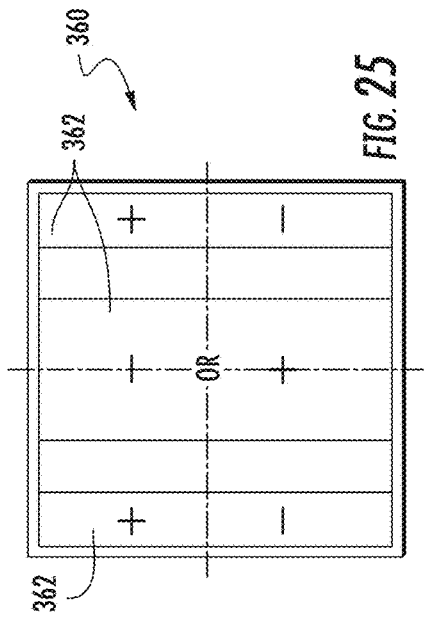
FIG. 24 is a bottom view of a conventional LED package.
Figure 25:
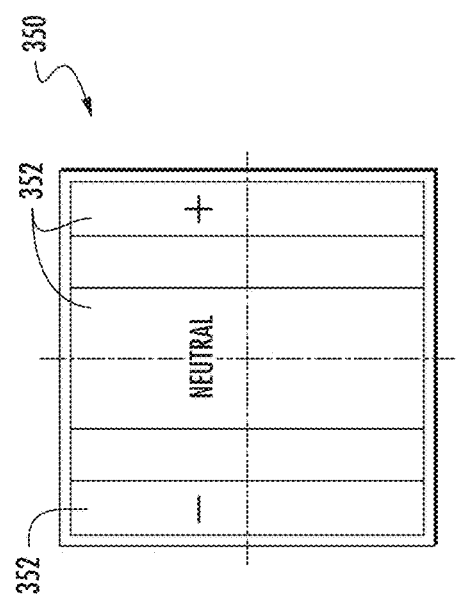
FIG. 25 is a top view of an LED package according to aspects of the present disclosure.

Different embodiments of the disclosure herein can also comprise a multiple orientation component. FIG. 24 shows the backside of a conventional LED package 350 having conventional backside pads 352 being conventional −/n/+. These conventional LED packages can only function properly in one orientation. FIG. 25 shows one embodiment of an LED package 360 according to the disclosure herein that can comprise backside pads 362 that are not single orientation type and can comprise contacts that allow for different orientation. In the embodiments shown, the contact pads are +/−/+ or −/+/−, with this symmetric arrangement allows for mounting at two orientations. This allows for easier pick and place and design considerations for the end user. This can also be implemented for 3V designs for different products.

Turning now to FIGS. 26-32, in some embodiments provided herein are light emitting diode (LED) devices and systems comprising a submount with one, two, three, four, or more, i.e. a plurality, LEDs disposed thereon. The submount can comprise an upper surface and a bottom surface, with the plurality of LEDs comprising an upper surface and one or more sides. The plurality of LEDs can be arranged on the surface of the submount in any desired orientation or configuration, such as for example in a square or rectangular pattern such as depicted in FIG. 26. In some aspects a phosphor layer can be disposed on the upper surface and one or more sides of the plurality of LEDs.

The LEDs can be spaced apart by a distance ranging from about 0 to about 300 micrometers (μm). That is, the gap between each of the plurality of LEDs disposed on the upper surface of the submount can be about 0 to about 300 μm wide. By spacing the LEDs with a gap less than 300 μm the emission pattern can be optimized. For example, in some embodiments an LED device as disclosed herein can be configured to produce an emission pattern devoid of a deadspot, or devoid of an optical cross. Moreover, by controlling the spacing between LEDs, emission pattern can have a more uniform color as compared to LED devices with spacing outside the parameters as disclosed herein. Particularly, in some embodiments the LEDs are spaced apart by a distance ranging from about 0 μm to about 80 μm, or from a distance ranging from about 80 μm to about 160 μm.

In addition to controlling the spacing between the LEDs disposed on the LED devices disclosed herein, in some embodiments a phosphor layer is disposed between the LEDs, and particularly in the gaps between the LEDs. The phosphor layer can also be disposed on the upper surface of the LEDs, on any outer side or surface of the LEDs and even on any portions of the submount not covered by an LED chip. Such a phosphor layer can be uniformly and evenly applied to these surfaces to provide a substantially uniform layer thickness. Such uniformity in the phosphor layer can be desirable in some aspects, particularly where the LEDs are configured to emit light from the upper surface and all sides of the LEDs.

Figure 26A:
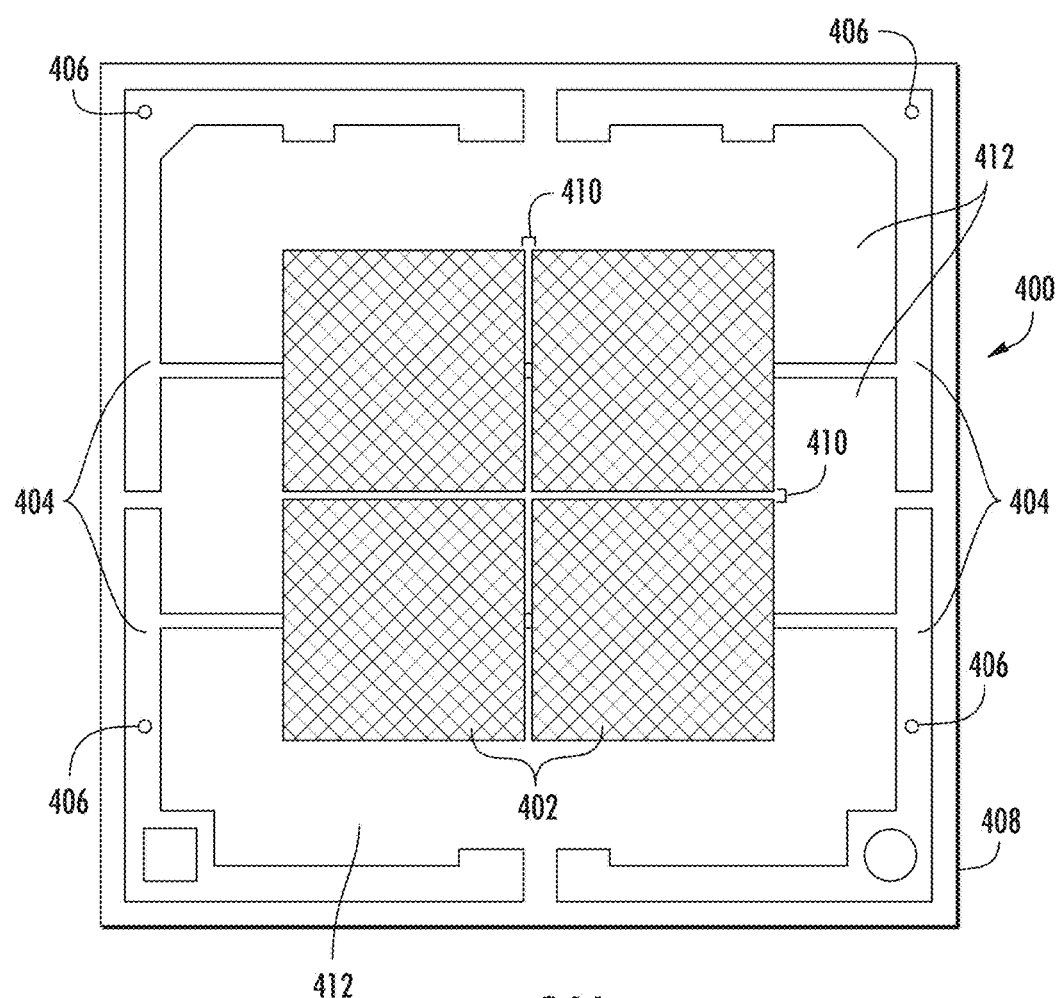
FIGS. 26A and 26B are top views of LED devices according to aspects of the present disclosure.
Figure 26B:
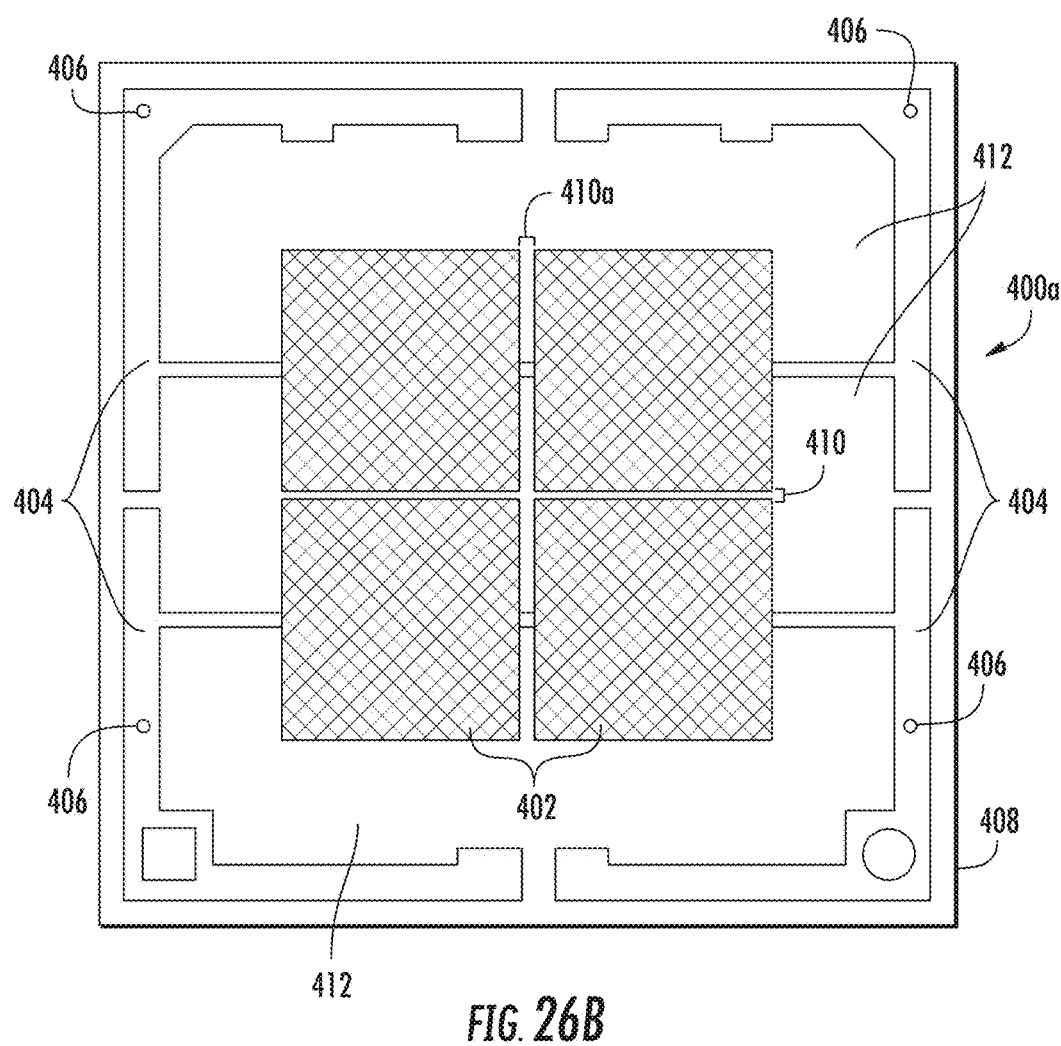

FIGS. 26A and 26B depict light emitter devices 400 and 400a, respectively, and particularly multi-die LED components, comprising a submount 408 and one or more light emitters 402 disposed on submount 408. Any number of light emitters 402, or LEDs, can be disposed on or applied to submount 408, including for example four LEDs as shown in FIGS. 26A and 26B. An upper surface of submount 408 can in some embodiments comprise a reflective material 412, such as for example a solder mask or other material. Light emitter device 400 can also include light emitters 402 configured to emit light from the upper surface and all sides of the LEDs. Additionally, LEDs 402 can each have a different targeted color.

In some embodiments a submount 408, or substrate, can comprise electronic traces 404, or conductive traces, but in some examples, device 400 could be based on a leadframe construction where no traces are on top, or any other appropriate construction. In some embodiments a die attach material, or solder bumps, can be provided to create an electrical contact between light emitters 402 and electronic traces 404. As discussed hereinabove, in some embodiments conductive vias 406 are included that pass through the submount 408 between the electronic traces 404 and contact pads located on the bottom surface of the submount 408. The LEDs and submount can comprise any of the devices and materials described above and can be arranged in many different ways. The pads and vias can similarly be made of different materials be arranged in the different ways as described herein.

The LEDs 402 can be spaced apart by a distance ranging from about 0 to about 300 micrometers (μm). This spacing creates a gap 410/410a between each of the plurality of LEDs 402 disposed on the upper surface of submount 408. By way of example and not limitation, gap 410/410a between LEDs 402 can be about 0 μm to about 80 μm, or about 10 μm to about 70 μm, or about 20 μm to about 60 μm, or about 30 μm to about 50 μm, or about 80 μm to about 160 μm, or about 90 μm to about 150 μm, or about 100 μm to about 140 μm, or about 110 μm to about 130 μm. As discussed further below, gap 410/410a can in some embodiments be zero, or non-existent, i.e. no gap, wherein adjacent LEDs 402 abut directly against one another. Gap 410/410a can be precisely controlled to optimize the emission pattern produced by the LED device 400, as discussed herein.

As depicted in FIG. 26A, gap 410 can be the same, or substantially similar, for each gap (horizontal and vertical gaps as depicted in FIG. 26A) between each of the plurality of LEDs 402. Alternatively, as depicted in FIG. 26B, the gaps between the plurality of LEDs can be asymmetric. By way of example and not limitation, in FIG. 26B horizontal gap 410 can by asymmetric, or of a different size, than vertical gap 410a. Depending on the number and orientation of LEDs, any asymmetric configuration of the gaps is possible as desired.

Figure 27A:
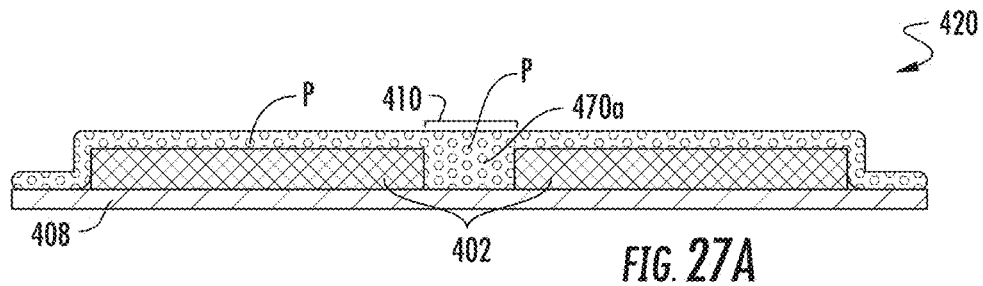
FIGS. 27A-27D are cross-sectional views of LED devices according to aspects of the present disclosure.

FIGS. 27A-27D depict cross-sectional views of LED devices, such as for example the LED device 400 of FIG. 26, with varying gap sizes and/or phosphor layers. For example, FIG. 27A depicts a cross-sectional view of a LED device 420 comprising a submount 408, LEDs 402 disposed on an upper surface of submount 408, and phosphor 470a, or phosphor layer, with phosphor particles P, disposed or applied over LEDs 402 and submount 408. LEDs 402 mounted on submount 408 can be spaced apart to form a gap 410 therebetween. Phosphor 470a can be disposed or applied between LEDs 402 in gap 410. As illustrated in FIG. 27A, the distance between the spaced apart LEDs 402, i.e. gap 410, can be greater than a particle size of phosphor particles P in the phosphor layer 470a.

Figure 27B:
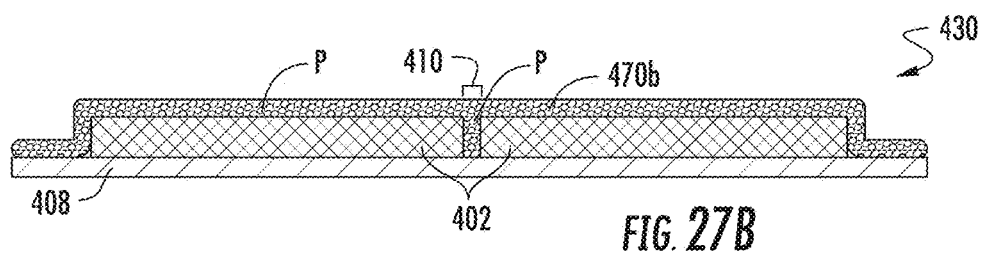

FIG. 27B depicts a cross-sectional view of a LED device 430 comprising a submount 408, LEDs 402 disposed on an upper surface of submount 408, and phosphor 470b, or phosphor layer, with phosphor particles P, disposed or applied over LEDs 402 and submount 408. LEDs 402 mounted on submount 408 can be spaced apart to form a gap 410 therebetween. Phosphor 470b can be disposed or applied between LEDs 402 in gap 410. As illustrated in FIG. 27B, the distance between the spaced apart LEDs 402, i.e. gap 410, can be at least partially or completely filled with a multimodal phosphor 470b (with multiple sizes of phosphor particles P).

Figure 27C:
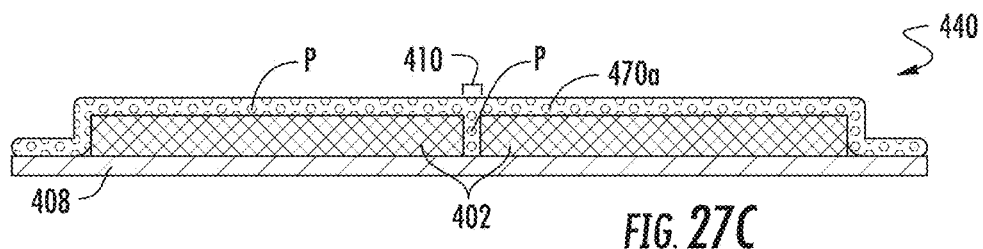

FIG. 27C depicts a cross-sectional view of a LED device 440 comprising a submount 408, LEDs 402 disposed on an upper surface of submount 408, and phosphor 470a, or phosphor layer, with phosphor particles P, disposed or applied over LEDs 402 and submount 408. LEDs 402 mounted on submount 408 can be spaced apart to form a gap 410 therebetween. Phosphor 470a can be disposed or applied between LEDs 402 in gap 410. As illustrated in FIG. 27C, the distance between the spaced apart LEDs 402, i.e.

gap 410, can be substantially similar to or greater than a particle size of phosphor particles P in the phosphor layer 470a. Also, in some aspects phosphor particles other than just particles P shown in FIG. 27C can be present.

Figure 27D:
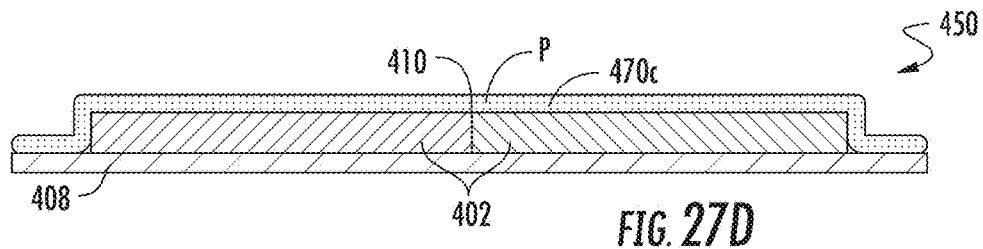

FIG. 27D depicts a cross-sectional view of a LED device 450 comprising a submount 408, LEDs 402 disposed on an upper surface of submount 408, and phosphor 470c, or phosphor layer, with phosphor particles P, disposed or applied over LEDs 402 and submount 408. LEDs 402 mounted on submount 408 can be arranged or oriented on submount 408 such that there is no space therebetween, i.e. they abut against one another. Thus, the size of gap 410 is zero, substantially zero, or negligible. With no gap or space between LEDs 402 no phosphor 470c is disposed or applied between LEDs 402.

Figure 28:
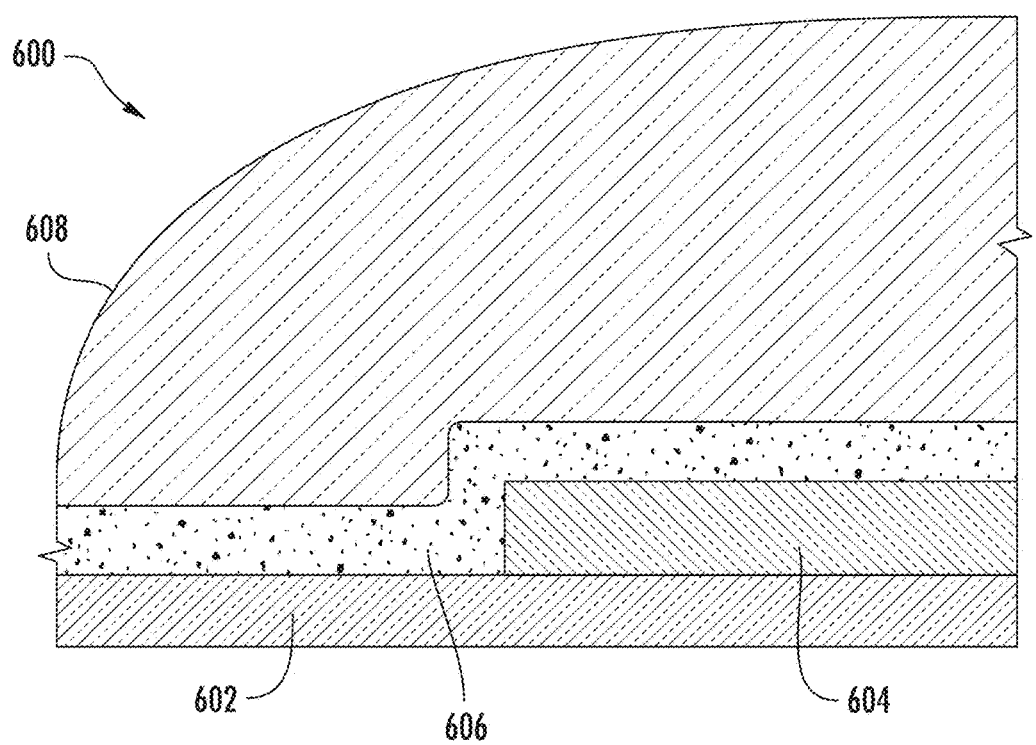
FIG. 28 is a cross-sectional view of an LED device according to aspects of the present disclosure.

FIG. 28 is a cross-sectional view of an LED device according to the present disclosure. FIG. 28 shows one embodiment of an LED package or device 600 comprising a submount 602, with an LED chip 604 mounted on the submount's top surface. As described above, many different LEDs can be used with the embodiment shown comprising a blue emitter such as a blue emitting EZ LED chip, or a flip chip LED, for example from Cree, Inc. A phosphor layer 606, such as for example a silicone phosphor matrix, can be included over the LED chip 604 and the top surface of the submount 602. In this embodiment no smoothing silicone layer or reflective layer is included over the phosphor layer 606. Instead, the phosphor layer 606 is configured to extend over the edge of the LED chip 604 and down to the submount 602 in a substantially uniform thickness so as to avoid a sloped or narrowing thickness where the corner of the LED chip can be exposed. Such a configuration can comprises a substantially squared off edge to the phosphor layer 606 that substantially mimics the edge of the LED chip 604 as depicted in FIG. 28. In some embodiments an optional encapsulant (molding layer) 608 can also be provided as discussed hereinabove (see, e.g. FIG. 10).

Phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths.

Phosphors can in some embodiments be included in an encapsulant used on an LED device. The phosphor can emit radiation in the visible spectrum having lower energy than the radiation emitted by a light emitter and does so in response to the wavelength emitted by the emitter. Combinations of phosphors can be used in conjunction with the blue or UV-emitting chip/LED to create white light; e.g. blue and yellow, blue and green and red, and blue and green and yellow and red. Using three or more colors can provide an opportunity to select a particular white point and a better color rendering. It is also expected that LEDs with more than one emission peak will be useful in exciting one or more phosphors to produce white light.

Phosphors and/or phosphor compounds can be selectively added and/or applied in any desired amount or quantity to clear or substantially clear substrates, wafers or sheets of material. Application of the phosphor and/or phosphor compounds can be achieved via any suitable method including, for example, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including for example as described in U.S. Pat. No. 8,410,679 to Ibbetson et al., and U.S. Pat. No. 8,425,271 to Hussell et al., the disclosures of which are each hereby incorporated by reference herein in their entireties. In some embodiments the phosphor compound applied to a clear substrate, e.g. sapphire wafer, is conformal to the shape and/or surface of the clear substrate. That is, a conformal layer of phosphor or phosphor compound can, for example, have an at least substantially uniform thickness.

The thickness of phosphor compound and/or phosphor layer on the clear substrate can, for example, range between approximately 2 µm and approximately 100 µm, however, any thickness of phosphor can be provided as desired. The thickness that is used may be selected to reduce or minimize blue light conversion in a planar surface, self-absorption and/or scattering, and may depend on the coating process, the density of the phosphor, other components in the phosphor compound, e.g. silicone, and/or the desired application.

Phosphor particles used for example in a phosphor layer covering upper surfaces of and sides of the LEDs and phosphor disposed in a gap between LEDs can vary in size and be of any suitable color or a plurality of colors desired for affecting light. For example and without limitation, phosphor particles can range in size from approximately 5 µm to 40 µm, and the sizes can depend on the target application and desired color output. The phosphor particle sizes and range of sizes can be different for different phosphor colors. Where a gap exists between any two LEDs, it is envisioned in one aspect according the disclosure herein that as large a phosphor particle size as possible be used in the gap between any given two LEDs where the gap is small or tight as disclosed herein. This feature can for example be useful in order to result in light output that is devoid of and without a deadspot or any type of optical cross.

The d50 value (mass-median-diameter (MMD) where MMD is considered to be the average particle diameter by mass) for phosphor particles can be different for different colors of phosphors. For example, yellow phosphor can contain phosphor particles that can range in sizes, as can green or red phosphors. The d50 value for yellow phosphor can be different from the d50 value for red phosphor or for the d50 value for red phosphor.

In accordance with the disclosure herein, one or more colors or two or more colors of phosphors can be used for the phosphor. For example, one or more colors of phosphor can be used for the phosphor layer disposed on upper surfaces and sides of the LEDs and for phosphor between gaps that exist between any of the LEDs. A single phosphor color can alternatively be used, or a blend of more than two phosphor colors can be used. It is also envisioned that any combination of phosphor colors can be used in any of the phosphor locations. For example and without limitation, a blend of phosphor colors can be used for the phosphor layer covering the LEDs and the sides of the LEDs, while a single color phosphor can be used in the gap between the LEDs. The reverse of this could also be used such that a single phosphor color can be used for the phosphor layer covering the LEDs and the sides of the LEDs, while a blend of two or more phosphor colors can be used in the gap between the LEDs.

As described above, the width of the gap between any given two or more LEDs can range for example from 0 µm to 300 µm. As illustrated for example with respect to FIGS.

27A-27D above, phosphor with various particle sizes P can be used within the gap between LEDs. The ratio of phosphor particle size for phosphor in a given gap to the width of the gap between LEDs can vary according to the disclosure herein. For example and without limitation, the ratio of particle size (d50 value, average particle size or largest particle size present) for a phosphor particle in the gap to the width of the gap between LEDs can be approximately 20% or more. The ratio can range, for example, from approximately 20% to approximately 75% in some aspects. In some aspects, the ratio can be approximately 25% or more, approximately 30% or more, approximately 35% or more, approximately 40% or more, approximately 45% or more, approximately 50% or more, approximately 55% or more, approximately 60% or more, approximately 65% or more, or approximately 70% or more.

Figure 29A:
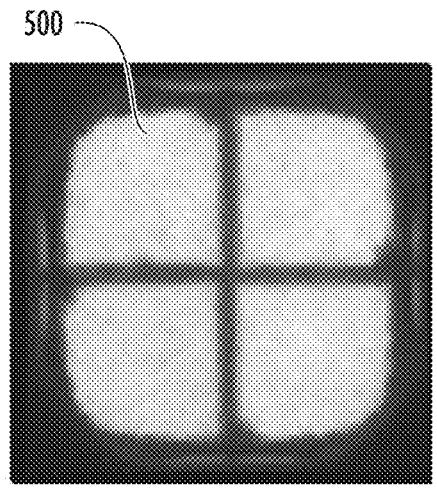
FIGS. 29A-29B are light emission images comparing light emissions from traditional LED devices (FIG. 29A) and LED devices according to the present disclosure (FIG. 29B)
Figure 29B:
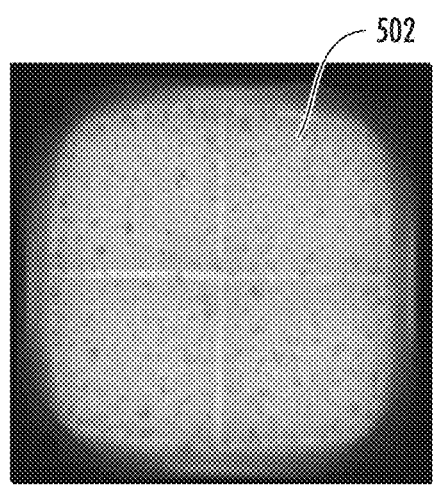

By controlling the spacing of the LEDs and keeping the gap between the LEDs within the specified ranges disclosed herein, and in some embodiments configuring phosphor as described herein and illustrated in FIGS. 27A-27D and 28, the emission profile and properties of the LED devices and systems can be enhanced. Particularly, as shown in FIGS. 29A and 29B, the deadspot or optical cross seen in traditional or currently available LED devices can be minimized or completely eliminated in LED devices as disclosed herein. FIG. 29A shows a light emission image 500 of an LED device with spacing between the LEDs greater than 300 μm. An optical cross is clearly visible between the four illuminated LEDs. FIG. 29B shows a light emission image 502 of an LED device with spacing between the LEDs less than 300 μm, wherein the optical cross is faintly visible and is substantially eliminated. The optical cross can be defined as the visible reduction or absence of light in the areas corresponding to the gaps between the LEDs.

Figure 30A:
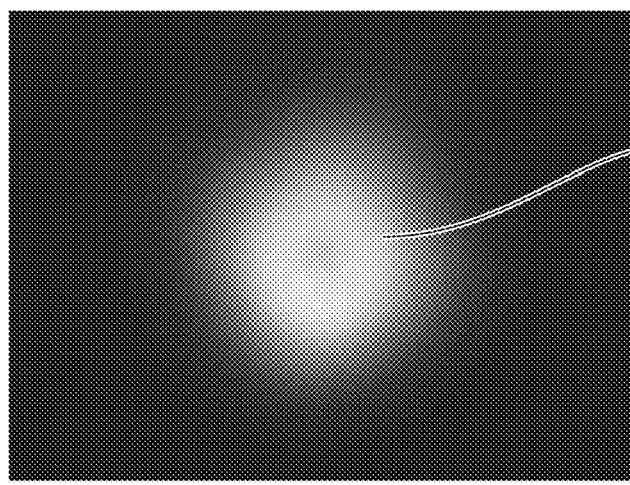
FIGS. 30A-30B are light emission images comparing light emissions from traditional LED devices (FIG. 30A) and LED devices according to the present disclosure (FIG. 30B)
Figure 30B:
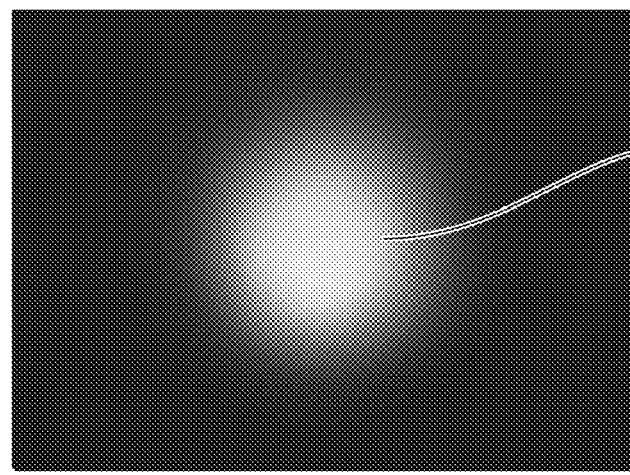

By eliminating or substantially minimizing the optical cross as shown in FIG. 29B, the optical output or emission profile can be improved. For example, FIGS. 30A and 30B are light emission images comparing light emissions from the LED devices in FIGS. 29A and 29B, respectively. In FIG. 30A the light emission image 504 shows a deadspot in the center of the light emission, whereas no deadspot is present, or is at least substantially minimized, in light emission image 506 from the LED devices of FIG. 29B. Thus, by configuring the LEDs on the submount such that the gap between each chip is less than 300 μm, or in some embodiments about 0 μm to about 80 μm, or about 80 μm to about 160 μm, the optical output can be enhanced such that an optical cross and/or deadspot can be completely or substantially eliminated. The deadspot can be defined as a diminished presence of light in the center, or other portion, of a light emission or optical output.

Figure 31A:
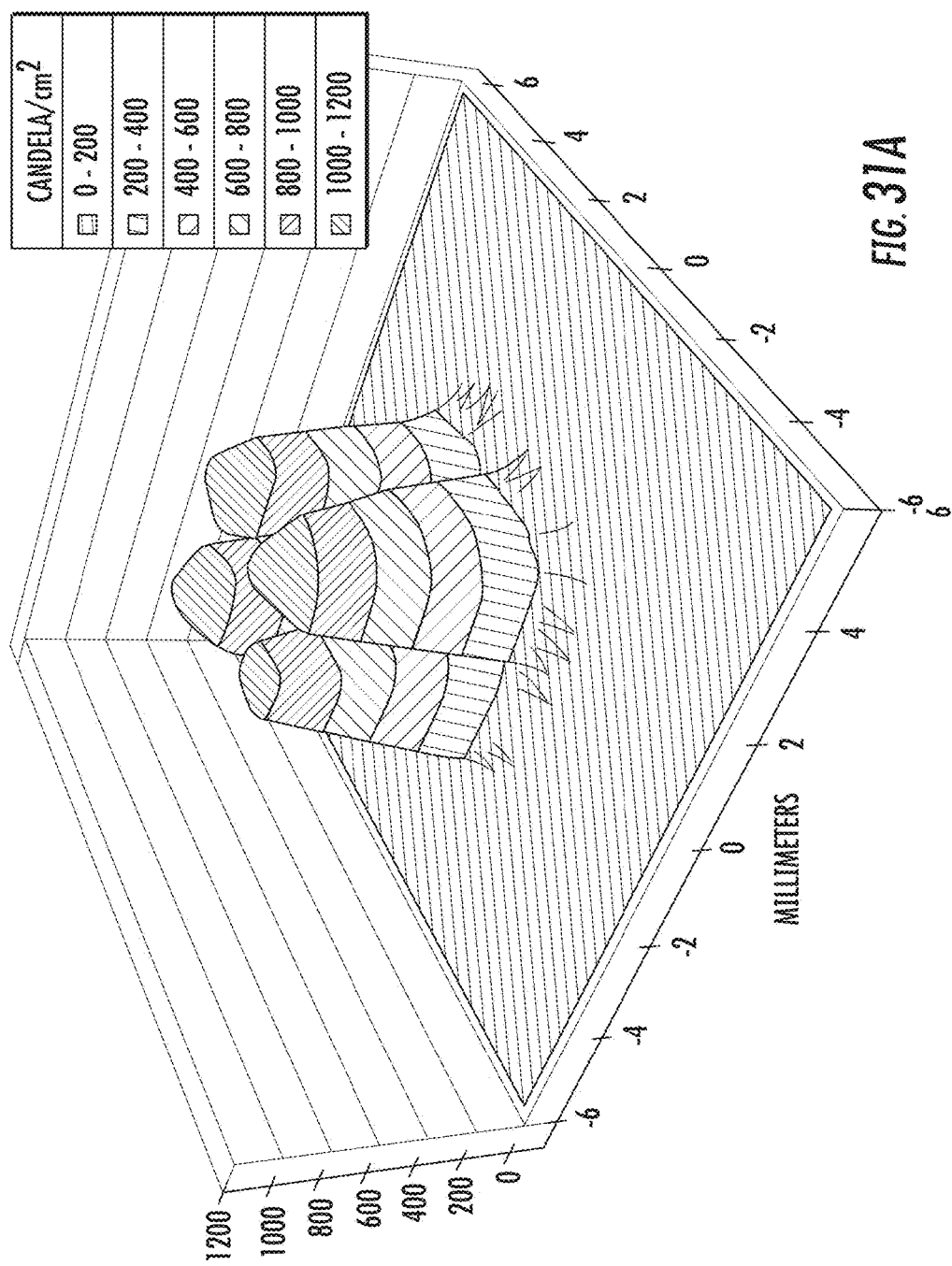
FIGS. 31A-31B are 3D intensity maps comparing light emissions from traditional LED devices (FIG. 31A) and LED devices according to the present disclosure (FIG. 31B)
Figure 31B:
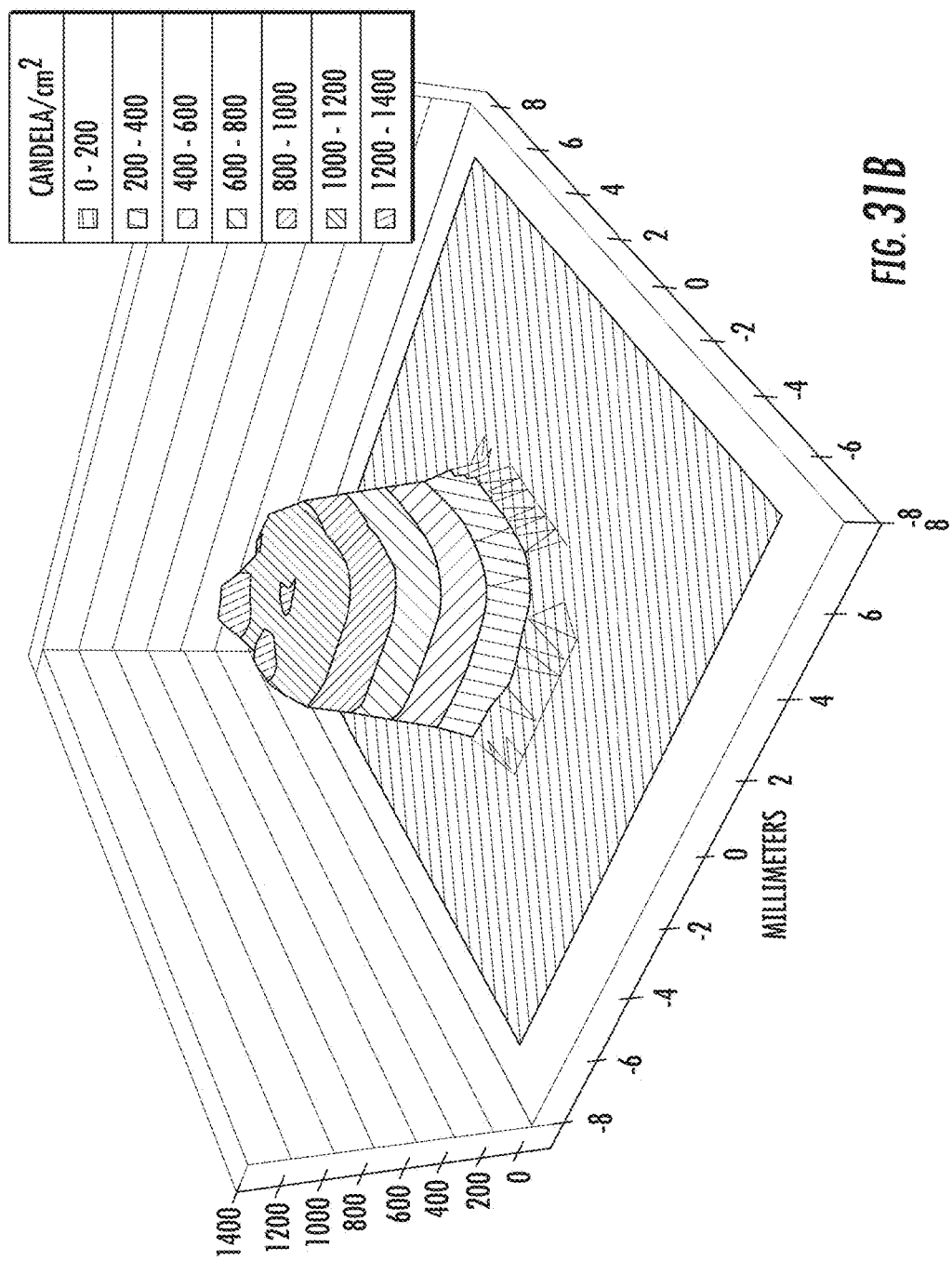
Figure 32:
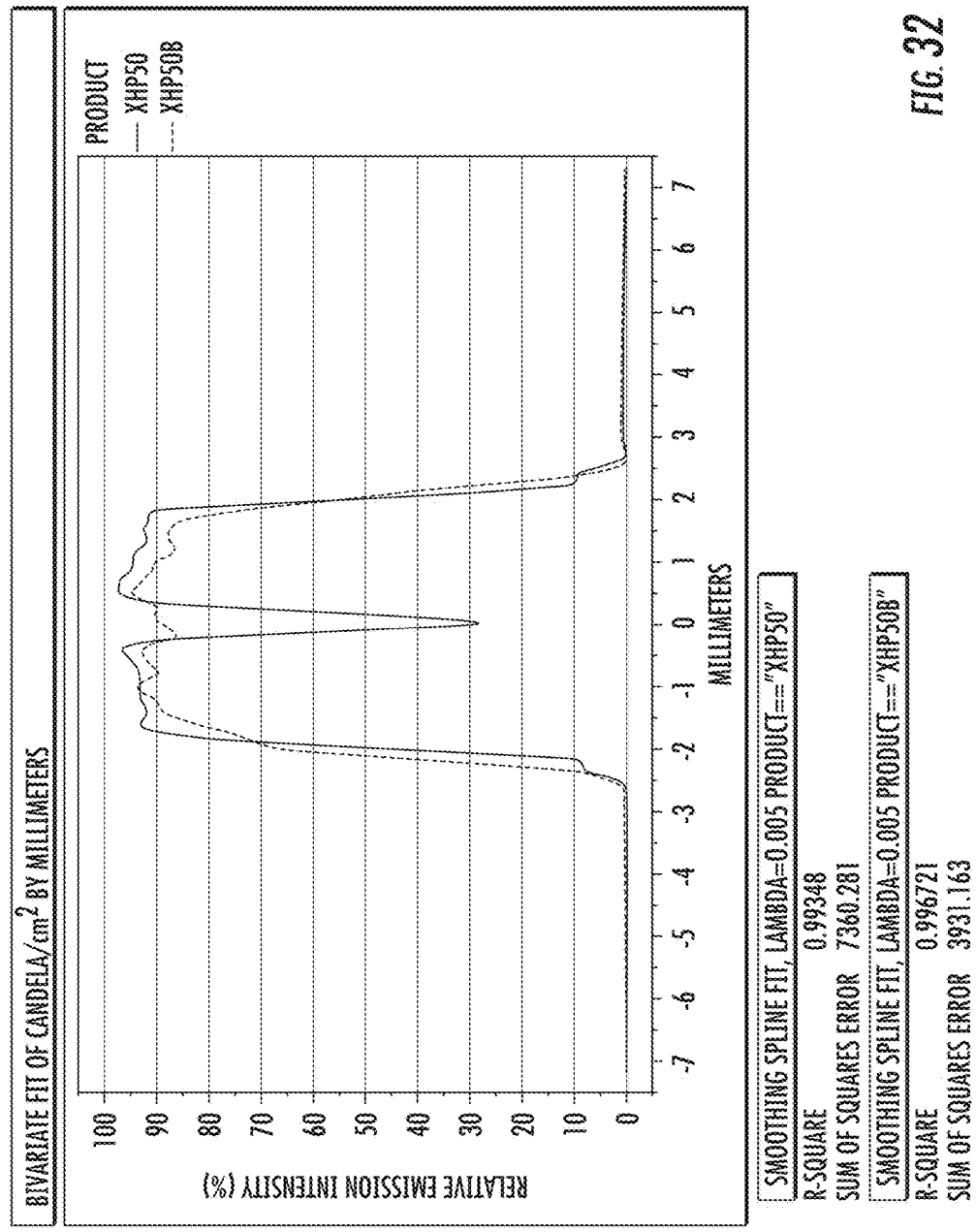
FIG. 32 is an intensity across component plot comparing light emissions from traditional LED devices and LED devices according to the present disclosure.

These enhancements in the light emission properties of the disclose LED devices and systems are further illustrated in FIGS. 31A, 31B and 32. FIGS. 31A-31B are 3D intensity maps comparing light emissions from an LED device with gaps between the LEDs exceeding 300 μm (FIG. 31A) and an LED device with gaps between the LEDs less than 300 μm (FIG. 31B). As can be seen in FIG. 31B, the light intensity, or candela/cm$^2$, is more uniformly distributed in FIG. 31B. The absence or significant reduction in an optical cross is also noticeable in FIG. 31B where the space between the LEDs is less than 300 μm, as disclosed herein.

FIG. 32 is an intensity across component plot comparing light emissions from an LED device with gaps between the LEDs exceeding 300 μm (solid line; XHP50) versus an LED device with gaps between the LEDs less than 300 μm (dashed line; XPH50B). Here again the relative emission intensity is more uniform across the component from the LED device having the space between the LEDs less than 300 μm (dashed line; XPH50B).

In some embodiments provided herein are methods of making a LED component, device or system such as those depicted in FIGS. 26 and 27A-27E. Such methods can comprise providing a submount comprising an upper surface and a bottom surface, providing a plurality of LEDs, and disposing or attaching the LEDs to an upper surface of the submount. The plurality of LEDs plurality of LEDs can be disposed or applied to the submount while also controlling the spacing between each chip such that the distance or gap between each chip ranges from about 0 to about 300 micrometers (μm). In some embodiments a further step of applying a phosphor layer on the upper surface and one or more sides of the plurality of LEDs can also be completed.

In some examples, LEDs used in the devices and components herein can have different targeted colors selected so that devices can operate as a pixel and produce a range of colors within its color gamut by energizing different combinations of LEDs. For example, LEDs can include UV, blue or green LEDs, such as a group III nitride based LED chip comprising negatively doped (n-type) epitaxial layer(s) of gallium nitride or its alloys and positively doped (p-type) epitaxial layers of gallium nitride or its alloys surrounding a light emitting active region; a red LED chip, such as an AlInGaP based red LED chip; a white LED chip (e.g., blue LED chip with phosphor(s) layer(s)), and/or a non-white phosphor based LED chip.

Traces, electrical contacts, leads and contact pads, as described herein, can comprise any suitable electrically conductive material, e.g., Cu, finished with electroless Ag, Ni—Ag, ENIG, ENIPIG, HASL, OSP, or the like. Traces can be applied over one or more surfaces of a substrate via plating (e.g., via electroplating or electroless plating), depositing (e.g., physical, chemical, and/or plasma deposition, CVD, PECVD, etc.), sputtering, or via any other suitable technique. In some aspects, traces can comprise a metal or metal alloy which may contain (in whole or part) copper (Cu), silver (Ag), gold (Au), titanium (Ti), palladium (Pd), aluminum (Al), tin (Sn), combinations thereof, and/or any other suitable conductor.

In some aspects, substrates and/or submounts can comprise a printed circuit board (PCB), a metal core printed circuit board (MCPCB), a flexible printed circuit board, a dielectric laminate (e.g., FR-4 boards as known in the art), a ceramic based substrate, or any other suitable substrate for mounting LEDs and/or LED packages. In some aspects such substrates can comprise one or more materials arranged to provide desired electrical isolation and high thermal conductivity. For example, at least a portion of such substrates may comprise a dielectric to provide the desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester etc. In some aspects, such substrates comprises a flexible circuit board, which can allow the substrate to take a non-planar or curved shape allowing for providing directional light emission with the solid state emitters also being arranged in a non-planar manner.

In some aspects, LEDs can be horizontally structured so that the LEDs mounted on a substrate or submount can be electrically connected to traces without the use of wire bonding. For example, each LED can be a horizontally structured device where each electrical contact (e.g., the anode and cathode) can be disposed on a bottom surface of the LED. Die attaching LEDs using any suitable material and/or technique (e.g., solder attachment, preform attachment, flux or no-flux eutectic attachment, silicone epoxy attachment, metal epoxy attachment, thermal compression attachment, bump bonding, and/or combinations thereof) can directly electrically connect LEDs to electrical traces without requiring wire bonds.

In some aspects, the LEDs in the LED devices and systems disclosed herein can be devices that do not comprise angled or beveled surfaces. For example, such LEDs can be an LED device that comprises coplanar electrical contacts on one side of the LED (bottom side) with the majority of the light emitting or transmitting surface being located on the opposite side (upper side), also know as a "flip-chip". LEDs can be bump bonded to traces using bumps of solder (or other appropriate conductive material) and force, energy (e.g., ultrasonic), and/or heat.

In some aspects, LED devices can optionally include diffuse layers for optics, lenses, polarizers, anti-reflective (AR) coating, anti glare, micro lenses, light steering, parallax barrier, lenticular arrays, and so on. As a result, the diffuse reflection of such devices can be 5% or less in the visible part of the spectrum.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A light emitting diode (LED) device comprising:
   a submount comprising an upper surface and a bottom surface;
   a plurality of LEDs disposed on the upper surface of the submount, the plurality of LEDs each comprising an upper surface of a diode and one or more sides, the LEDs being spaced apart with a gap between the LEDs;
   an encapsulant comprising an upper curved surface and one or more planar side surfaces, the upper curved surface having a radius curvature that is greater than half a length or width of the submount, wherein the one or more planar side surfaces comprise truncated sections of the upper curved surface so that the encapsulant does not overhang an outermost edge of the submount, at least a portion of each of the one or more planar side surfaces extending to a respective outermost edge of the upper surface of the submount; and
   a phosphor layer disposed on the upper surface of the diodes, on one or more sides of the plurality of LEDs and in the gap between the LEDs,
   wherein the gap between the LEDs ranges from about 1 to about 300 micrometers (μm),
   wherein a ratio of a particle size of phosphor in the gap to a width of the gap between the LEDs is approximately 30% to approximately 75%,
   wherein the device, based on the gap between the LEDs and the ratio of the particle size of phosphor in the gap to the width of the gap, is configured to produce an emission pattern devoid of a deadspot.

2. The device of claim 1, wherein the LEDs comprise LED chips.

3. The device of claim 1, wherein the gap between the LEDs ranges from about 1 μm to about 80 μm.

4. The device of claim 1, wherein the plurality of LEDs comprise at least four LEDs.

5. The device of claim 1, wherein the phosphor layer is also disposed on the upper surface of the submount.

6. The device of claim 5, wherein the phosphor layer substantially uniformly covers the upper surface and one or more sides of the plurality of LEDs and the upper surface of the submount.

7. The device of claim 1, wherein all sides of the LEDs are covered with the phosphor layer.

8. The device of claim 1, wherein the device is configured to emit light from the upper surface and all sides of the LEDs.

9. The device of claim 1, further comprising one or more electrically conductive contacts disposed on the bottom surface of the submount.

10. The device of claim 1, wherein a ratio of the upper surface of the diodes to the upper surface of the submount is greater than 0.18.

11. A light emitting diode (LED) device comprising:
    a submount comprising an upper surface and a bottom surface;
    at least four LEDs disposed on the upper surface of the submount, the at least four LEDs each comprising an upper surface of a diode and one or more sides, each of the at least four LEDs spaced apart with a gap therebetween; and
    an encapsulant comprising an upper curved surface and one or more planar side surfaces, the upper curved surface having a radius curvature that is greater than half a length or width of the submount, wherein the one or more planar side surfaces comprise truncated sections of the upper curved surface so that the encapsulant does not overhang an outermost edge of the submount, at least a portion of each of the one or more planar side surfaces extending to a respective outermost edge of the upper surface of the submount;
    a phosphor layer disposed over the upper surface of the diodes of the at least four LEDs and filling in the gap therebetween,
    wherein a ratio of a particle size of phosphor in the gap to a width of the gap between the LEDs is approximately 30% to approximately 75%,
    wherein the LED device, based on the gap between the LEDs and the ratio of the particle size of phosphor in the gap to the width of the gap, is configured to produce an emission pattern devoid of a deadspot, and wherein the phosphor layer comprises a high density phosphor, wherein the high density phosphor comprises a ratio of phosphor to binder of about 2 to 1 or greater.

12. The device of claim 11, wherein the device is configured to produce an emission pattern devoid of an optical cross.

13. The device of claim 11, wherein the gap between the LEDs ranges from about 1 μm to about 80 μm.

14. The device of claim 11, wherein the gap between the LEDs is greater than a particle size of phosphor in the phosphor layer.

15. The device of claim 11, wherein the phosphor layer is also disposed on the upper surface of the submount.

16. The device of claim 11, wherein the LEDs each comprise an upper surface and four sides, wherein the phosphor layer is disposed on each of the upper surface and four sides of all LEDs.

17. The device of claim 16, wherein the device is configured to emit light from the upper surface and all sides of the LEDs.

18. The device of claim 11, wherein a ratio of the upper surface of the diodes to the upper surface of the submount is greater than 0.18.

19. A light emitting diode (LED) device comprising:
   a submount comprising an upper surface and a bottom surface;
   a plurality of LEDs disposed on the upper surface of the submount, the LEDs being spaced apart with a gap between the LEDs;
   an encapsulant comprising an upper curved surface and one or more planar side surfaces, the upper curved surface having a radius curvature that is greater than half a length or width of the submount, wherein the one or more planar side surfaces comprise truncated sections of the upper curved surface so that the encapsulant does not overhang an outermost edge of the submount, at least a portion of each of the one or more planar side surfaces extending to a respective outermost edge of the upper surface of the submount; and
   phosphor disposed in and filling the gap between the LEDs up to at least an upper surface of the LEDs,
   wherein the gap between the LEDs is substantially similar to the particle size of the phosphor,
   wherein the phosphor layer comprises a high density phosphor, wherein the high density phosphor comprises a ratio of phosphor to binder of about 2 to 1 or greater.

20. The device of claim 19, wherein the LEDs comprise LED chips.

21. The device of claim 19, further comprising phosphor disposed on the upper surface and one or more sides of the plurality of LEDs.

22. The device of claim 19, wherein phosphor on the upper surface and sides of the one or more LEDs comprises one or more phosphor colors.

23. The device of claim 19, wherein phosphor in the gap between the LEDs comprises only a single phosphor color.

24. The device of claim 19, wherein phosphor in the gap between the LEDs comprises one or more phosphor colors.

25. The device of claim 19, comprising a plurality of gaps between the LEDs and wherein the gaps differ in width.

26. The device of claim 19, wherein the gap between the LEDs ranges from about 1 μm to about 80 μm.

27. The device of claim 19, wherein a ratio of the upper surface of the diodes to the upper surface of the submount is greater than 0.18.

* * * * *